(12) United States Patent
Abushama

(10) Patent No.: US 9,614,118 B2
(45) Date of Patent: Apr. 4, 2017

(54) METHOD AND APPARATUS FOR DEPOSITING COPPER-INDIUM-GALLIUM SELENIDE (CUINGASE2-CIGS) THIN FILMS AND OTHER MATERIALS ON A SUBSTRATE

(71) Applicant: Jehad A. Abushama, San Jose, CA (US)

(72) Inventor: Jehad A. Abushama, San Jose, CA (US)

( * ) Notice: Subject to any disclaimer, the term of this patent is extended or adjusted under 35 U.S.C. 154(b) by 0 days.

(21) Appl. No.: 14/882,453

(22) Filed: Oct. 14, 2015

(65) Prior Publication Data

US 2016/0064593 A1 Mar. 3, 2016

Related U.S. Application Data

(62) Division of application No. 14/183,465, filed on Feb. 18, 2014, now Pat. No. 9,196,768.

(60) Provisional application No. 61/793,240, filed on Mar. 15, 2013.

(51) Int. Cl.
  *H01L 31/18* (2006.01)
  *H01L 31/032* (2006.01)
  *H01L 31/0749* (2012.01)
  *H01L 21/02* (2006.01)
  *H01L 31/0392* (2006.01)

(52) U.S. Cl.
  CPC .... *H01L 31/1872* (2013.01); *H01L 21/02488* (2013.01); *H01L 21/02491* (2013.01); *H01L 21/02502* (2013.01); *H01L 21/02568* (2013.01); *H01L 21/02573* (2013.01); *H01L 21/02614* (2013.01); *H01L 21/02631* (2013.01); *H01L 31/0322* (2013.01); *H01L 31/03923* (2013.01); *H01L 31/0749* (2013.01); *Y02E 10/50* (2013.01); *Y02E 10/541* (2013.01); *Y02P 70/521* (2015.11)

(58) Field of Classification Search
  None
  See application file for complete search history.

(56) References Cited

U.S. PATENT DOCUMENTS 4,284,130 A * 8/1981 Elias ................ F24D 9/00 165/53
6,037,241 A * 3/2000 Powell ................ C03C 17/002 118/718

(Continued)

*Primary Examiner* — Duy T Nguyen
*Assistant Examiner* — Bo Bin Jang
(74) *Attorney, Agent, or Firm* — Alexander Chen

(57) ABSTRACT

An apparatus for deposition of a plurality of elements onto a solar cell substrate that comprises: a housing; a transporting apparatus to transport the substrate in and out of the housing; a first tubing apparatus to deliver powders of a first elements to the housing; a first source material tube located outside of the housing and joined to a feeder tube of the tubing apparatus; a valve located inside of the first source material tube sufficient to block access between the first source material tube and the first feeder tube; a first heating tube located inside of the housing and connected to the first feeder tube; a similar second tubing apparatus to deliver powders of a second elements to the housing; a loading station for loading the substrate onto the transporting apparatus; one or more thermal sources to heat the housing and the first and second heating tube.

21 Claims, 7 Drawing Sheets

(c)

(d)

(56) References Cited

U.S. PATENT DOCUMENTS

2008/0095938 A1* 4/2008 Basol .................... C23C 14/562
　　　　　　　　　　　　　　　　　　　　　　427/255.26
2013/0130475 A1* 5/2013 Barden ............. H01L 21/02562
　　　　　　　　　　　　　　　　　　　　　　438/478

* cited by examiner (a)  (b)  (c)

(a)   (b)   (c)

(a)

(b)

(c)

(d)

METHOD AND APPARATUS FOR DEPOSITING COPPER-INDIUM-GALLIUM SELENIDE (CUINGASE2-CIGS) THIN FILMS AND OTHER MATERIALS ON A SUBSTRATE

INCORPORATION BY REFERENCE

This continuation application claims the benefit of priority to the filing date of U.S. non provisional patent application Ser. No. 14/183,465 "METHOD AND APPARATUS FOR DEPOSITING COPPER-INDIUM-GALLIUM SELENIDE (CuInGaSe2-CIGS) THIN FILMS AND OTHER MATERIALS ON A SUBSTRATE," filed on Feb. 18, 2014, which claims the benefit of priority under 35 U.S.C. 119(e) to the filing date of U.S. provisional patent application No. 61/793, 240 titled "METHOD AND APPARATUS FOR DEPOSITING COPPER-INDIUM-GALLIUM-SELENIDE (CuInGaSe2-CIGS) THIN FILMS AND OTHER MATERIALS ON A SUBSTRATE," filed on Mar. 15, 2013, and which are incorporated herein by reference in their entirety.

FIELD OF THE INVENTION

The present invention relates to a thin film solar cell, and more particularly to a method of manufacturing a Copper-Indium-Gallium-Selenide (CIGS) thin films and other materials on a substrate.

BACKGROUND OF THE INVENTION

The present invention relates generally to photovoltaic techniques. More particularly, the present invention provides a method and structure for a thin-film photovoltaic device using Copper-Indium-Gallium-Selenide, and other materials. In general, solar cells are photovoltaic devices that convert sunlight directly into electrical power. The most common solar cell material is Silicon (Si), which is in the form of single or polycrystalline wafers. However, because the cost of electricity generated using silicon-based solar cells is higher than the cost of electricity generated by the more traditional methods, a method to reduce the cost of solar cells is desirable. One way of reducing the cost of solar cells is to develop low-cost thin film growth techniques that can deposit solar-cell-quality absorber materials on large area substrates and to fabricate these devices using high-throughput, low-cost methods. A thin-film solar cell (TFSC), which is also known as thin film photovoltaic cell (TFPV), is a solar cell that is made by depositing one or more thin layers of photovoltaic material on a substrate.

In general, solar cells are classified into various types according to a material of a light-absorbing layer. Solar cells may be categorized into silicon solar cells having silicon as a light-absorbing layer, compound thin film solar cells using CIS (CuInSe2) or CdTe, III-V group solar cells, dye-sensitized solar cells, and organic solar cells.

Among the solar cells, silicon solar cells include crystalline solar cells and amorphous thin film solar cells. While bulk-type crystalline solar cells are widely used, the crystalline solar cells have high production cost due to expensive silicon substances and complicated manufacturing processes. However, by forming a solar cell of a thin film type on a relatively low cost substrate, such as glass, metal, or plastic, instead of a silicon wafer, reduction of photovoltaic production cost can be achieved.

Different photovoltaic materials are available to be deposited with various deposition methods on a variety of substrates, and the resultant thin-film solar cells are usually categorized according to the photovoltaic material used. Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Generally, photovoltaic compounds that include amorphous silicon (a-Si), Cadmium telluride (CdTe), and Copper-Indium-Gallium-Selenide (CIS or CIGS) are referred to as thin film solar cells.

Polycrystalline Copper Indium Gallium Diselenide or Cu(In,Ga)Se2 (CIGS) is the most promising of all thin film solar cells. Recently, the record efficiency of laboratory size CIGS thin film solar cells reached 20.8%. A typical device structure for a CIGS solar cell is illustrated in FIG. 1.

In this review and throughout the present invention disclosure, the different pieces of the solar cell will be referred to as shown in FIG. 1. In other words, 100 refers to the substrate, which can be made of Glass (e.g. Soda-Lime-Glass (SLG) or flexible glass), Metallic sheets or Plastic sheets (e.g. Polyimide); 101 refers to the barrier layer (e.g. $SiO_2$ or SiN), 102 refers to the back contact layer which can be made of one or more refractory metals like Molybdenum (Mo), Niobium (Nb), Tantalum (Ta), Tungsten (W) and/or Rhenium (Re); 103 refers to the CuInGaSe2 (CIGS) absorber layer; 104 refers to the buffer layer which can be made of CdS, ZnS, ZnO, In2Se3, and/or In2S3; 105 refers to an intrinsic layer (e.g. i-ZnO) followed by a transparent conduction oxide-TCO layer (e.g. Indium-Tin-Oxide (ITO) or Al:ZnO); and 106 refers to the metallic grids and Anti-reflecting (AR) coating.

Typically, a CIGS thin film may be deposited on a number of substrates 100 including glass (whether rigid or flexible), metallic sheets or plastic sheets (e.g. polyimide). A barrier layer 101 may be deposited on the substrate to minimize and/or prevent the diffusion of impurities from the substrate to the CIGS thin film. A back-contact layer 102 (e.g. Molybdenum-Mo or another refractory metal layer of about 1 μm thickness) may be deposited on the barrier-layer coated substrate using DC magnetron sputtering. On top of the back-contact layer 102, a CIGS layer 103 is deposited. For making solar cells, a CIGS chalcopyrite structure is required. Co-evaporation yielded the best device conversion efficiency of 20.8%. A typical high efficiency CIGS device has a Cu(In+Ga) ratio of 0.80-1.0 and a Ga(In+Ga) ratio of ~0.30. This Ga/(In+Ga) ratio can be varied from 0-1. The formation of CIGS thin film requires high temperature (450-800° C.). To complete the solar cell structure, a thin buffer layer 104 of about 500-1200 Å thickness (e.g. Cadmium Sulfide-CdS) is deposited on top of the CIGS layer, followed by depositing an intrinsic layer followed by depositing a transparent conducting oxide-TCO (e.g. i-ZnO/Al— ZnO or i-ZnO/ITO) 105; followed by depositing metallic front contacts and anti-reflecting coating (AR) 106. The best known method for depositing CdS, TCO and front contacts are Chemical Bath Deposition (CBD), RF sputtering and evaporation, respectively.

A temperature in the range of (450-800° C.) is usually required to make Cu-poor CIGS chalcopyrite structures from which CIGS thin film solar cells can be made. This temperature range is usually achieved by traditional heating methods (e.g. Infrared heating or Resistive/Electrical heating).

Currently in the existing art, there are two approaches to activate the formation of the CIGS chalcopyrite structure:

Approach I: In this approach, all four elements (Cu, In, Ga and Se) are deposited by Physical Vapor Deposition-PVD) onto an IR-heated substrate 100 which is already coated with a barrier layer 101 and/or back contact layer 102. As shown in FIG. 1, the substrate 100 can be Soda-Lime-Glass, other types of glass, a Metallic sheet or a Plastic sheet such as Polyimide. An appropriate heat profile such as the well-known three-stage process can be used.

In the first stage of the three-stage process, In and Ga are evaporated in the presence of Se vapor onto a heated substrate (at about 400° C.). In the second stage of the three-stage process, Cu is evaporated in the presence of Se vapor onto the heated substrate (at about 600° C.). In this stage, Cu-rich CIGS phase is formed. In the third stage, small amounts of In and Ga are evaporated to convert the CIGS structure into the Cu-poor Chalcopyrite CIGS phase from which CIGS thin film solar cells can be made. All stages are usually implemented under high vacuum (preferably a pressure of less than $1 \times 10^{-6}$ Torr). Typically, depositing a CIGS film using the three stage process takes about 40 minutes. Usually, Sodium which is an important dopant for CIGS crystallization is introduced through the Soda-Lime-Glass (which has Na as part of its constituents) or from an external source to have a better control on the amount introduced or if a different substrate is used.

Approach II: In this approach, Cu, In and Ga are deposited onto an unheated substrate 100 which is already coated with a barrier layer 101 and/or a back contact layer 102 as depicted in FIG. 1. Sodium (Na) which is an important dopant for CIGS crystallization is introduced through the Soda-Lime-Glass or from an external source to have better control on the amount introduced or if a different substrate is used.

The (Cu,In,Ga) layer deposited on 102/101/100 structure is then placed inside a furnace with inert gas environment that's capable of going up to the CIGS crystallization temperature of (400-800° C.). The structure is then heated up to >400° C. in the presence of Se. This selenization and heating steps are necessary to activate the formation of the CIGS chalcopyrite structure.

In both approaches above, traditional heating methods (Infra-Red-IR heating or resistive/electrical heating) are usually used as the methods for heating the substrate and activating the formation of CIGS.

Typically, Approach I results in more uniform compositional uniformity compared with Approach II which results in the well-known Ga-segregation problem in the back of the thin film and lateral compositional non-uniformity. Since In and Ga compete for Se, along with Cu, the composition of all elements is non-uniform and this causes losses in solar cell performance.

Lateral compositional non-uniformity and Ga segregation in the back of the film are more dominant in Approach II described above for the formation of the CIGS chalcopyrite structure from which thin film CIGS solar cells are made. In both approaches described above for activating the CIGS formation, Ga has the least compositional uniformity, laterally and along the depth of the film. This is because of Ga physical properties. Because of Ga segregation problem, Sulfur can be used to increase the bandgap near the surface of $Cu(In,Ga)(S,Se)_2$.

In the process of manufacturing CIGS thin films, there are various manufacturing challenges such as maintaining the structural integrity of substrate materials, ensuring uniformity and granularity of the thin film material, minimizing materials loss during the deposition process, etc. Conventional techniques that have been used so far are often inadequate in various situations and are so far incapable of producing cost-effective solar panels. Therefore, it is desirable to have improved systems and methods for manufacturing CIGS thin film photovoltaic devices.

OBJECTIVE OF THE INVENTION

It is therefore an objective of the invention to provide a novel method and apparatus to manufacture CIGS thin films on a substrate to reduce the cost of production of a solar cell.

It is therefore an objective of the invention to provide a novel method and apparatus to manufacture CIGS thin films on a substrate to reduce production time of a solar cell.

It is therefore an objective of the invention to provide a novel method and apparatus to manufacture CIGS thin films on a substrate to increase the quality of the CIGS thin films on a substrate of a solar cell.

It is therefore an objective of the invention to provide a novel method and apparatus to manufacture CIGS thin films on a substrate using a smaller production area to produce relatively larger solar cells.

Specifically, it is an objective of the invention to provide a novel method and apparatus to manufacture CIGS thin films on a substrate using Vapor Transport Deposition (VTD) or Gas Assisted Growth (GAG) technique in an apparatus.

It is also an objective of the invention to increase material utilization of all the constituents needed to fabricate CIGS thin films and solar cells.

It is also an objective of the invention to use Vapor Transport Deposition to deposit other layers in the CIGS solar cell including but not limited NaF, buffer layers (e.g. CdS, ZnS, In2Se3, In2S3, etc.), intrinsic zince oxide layer, transparent conducting oxide layer (TCO), metallic grids and Anti-reflecting coating.

Specifically, such Vapor Transport Deposition techniques (VTD) or Gas Assisted Growth (GAG) would include the utilization of various designed and configured heating tubes in an apparatus thereby allowing a smaller production area to produce relatively larger solar cells.

More specifically, such Vapor Transport Deposition technique includes vaporizing the material to be deposited, transporting it using a carrier gas and then depositing it on a substrate; all in one or more apparatus with controlled environment; in which the carrier gas flow rate, the temperature and the pressure are controlled.

It is also an objective of the invention to provide a novel method and apparatus to manufacture CIGS thin films on a substrate wherein the elements are sputtered onto the substrate.

It is further an objective of the invention to provide a novel method and apparatus to manufacture CIGS thin films on a substrate wherein the elements are sputtered onto the substrate in one chamber and other elements are deposited onto the substrate in the next chamber.

SUMMARY OF THE INVENTION

In a first aspect of the invention, an apparatus for deposition of a plurality of elements onto a solar cell substrate is disclosed comprising: a housing; a transporting apparatus to transport the substrate in and out of the housing; one or more tubing apparatus to deliver powders and/or gases and/or solid pieces of the elements and/or compounds to the housing wherein the tubing apparatus is comprised of one or more feeder tubes located outside of the housing and joined to the housing; a plurality of source material tubes located outside of the housing and joined to the feeder tubes; a plurality of valves located inside of the source material tubes sufficient to block access between the source material tubes and the feeder tubes; one or more heating tubes located inside of the housing and connected to the feeder tubes; a loading station for loading the substrate onto the transporting apparatus; one or more thermal sources to heat the housing and the heating tube.

In one embodiment, the feeder tubes and the heating tubes are constructed with Silicon Carbide, and/or Molybdenum disilicide (MoSi2), and/or Graphite, and/or Mullite and/or quartz, and/or another Ceramic material. In one embodiment, the heating tube is heated to a temperature between 50-2000° C. during its functional state. In one embodiment, the material source tubes provide the elements and/or compounds in powder form to the feeder tube when the valves are opened. In one embodiment, the material source tubes provide the elements and/or compounds in fluid form (either gas or liquid) or in the form of solid pieces to the feeder tube when the valves are opened.

In one embodiment, the feeder tubes contain carrier gas to carry the elements and/or compounds in powder form to the heating tubes inside the housing. In one embodiment, the heating tubes heat the elements and/or compounds in powder form and convert the elements and/or compounds to vapor form. In one embodiment, the carrier gas is selected from the group consisting of Helium, Nitrogen, Argon and/or Neon. In one embodiment, the heating tube is cylindrical and tubular in form. In one embodiment, the feeder tube is cylindrical and tubular in form. In one embodiment, the heating tube is rectangular in form. In one embodiment, the feeder tube is rectangular in form. In one embodiment, the heating tube is semi-cylindrical in form. In one embodiment, the feeder tube is semi-cylindrical in form. In one embodiment, the housing is made with material selected from the group consisted of Mullite, Silicon Carbide (SiC), Graphite and/or Ceramic. In one embodiment, the heating tube is permeable to the vapor and the carrier gas but not to the elements in powder form. In one embodiment, the heating tube is comprised of an upper portion and a lower portion wherein the lower portion faces the substrate and the upper portion is opposite to the lower portion wherein only the lower portion is permeable to the vapor and the carrier gas, but not to the elements and/or compounds in powder form. In one embodiment, the heating tube is made of non-porous ceramic material comprised of an upper portion and a lower portion wherein the lower portion faces the substrate and the upper portion is opposite to the lower portion wherein only the lower portion is comprised of a number of outlets making it permeable to the vapor and the carrier gas, but not to the elements and/or compounds in powder form. In one embodiment, the thermal source is selected from the group consisting of electrical power heating, IR heating, and RF and microwave heating. In one embodiment, the heating tube has a larger perimeter than the feeder tube. In one embodiment, a controlled, contained and monitored environment comprises an enclosure wherein the enclosure encloses the heating tube which is permeable to vapor and carrier gas, but not to the elements and/or compounds in powder form. In one embodiment, the transporting apparatus is comprised of a conveyor belt.

In a second aspect of the invention, an apparatus for deposition of a plurality of elements or compounds onto a solar cell substrate is disclosed comprising: providing a substrate; providing one or more elements or compounds for deposition on the substrate; providing a housing; providing a transporting apparatus to transport the substrate in and out of the housing; placing the substrate onto the transporting apparatus and having the transporting apparatus transport the substrate into the housing; providing one or more tubing apparatus to deliver powders of the elements or compounds to the housing wherein the tubing apparatus is comprised of one or more feeder tubes located outside of the housing and joined to the housing; a plurality of source material tubes located outside of the housing and joined to the feeder tube; a plurality of valves located inside of the source material tubes sufficient to block access between the source material tubes and the feeder tubes; one or more heating tubes located inside of the housing and connected to the feeder tubes; placing the elements or compounds into the source material tubes; opening the valves to allow the elements to move into the feeder tubes; providing a portion of carrier gas and feed the carrier gas into the feeder tubes; allowing the carrier gas to carry the elements or compounds from the feeder tubes into the heating tubes; providing one or more thermal sources to heat the housing and the heating tube and vaporizing the elements and/or compounds inside the heating tubes and allowing the elements and/or compounds to leave the heating tubes in vapor phase; allowing the elements or compounds to deposit onto the substrate after the vapors leave the heating tubes; transporting the substrate outside of the housing after the elements and/or compounds are deposited onto the substrate.

In one embodiment, the heating tube is cylindrical and tubular in form. In one embodiment, the feeder tube is cylindrical and tubular in form. In one embodiment, the heating tube is rectangular in form. In one embodiment, the feeder tube is rectangular in form. In one embodiment, the heating tube is semi-cylindrical in form. In one embodiment, the feeder tube is semi-cylindrical in form.

In one embodiment, the housing is made with materials selected from the group consisted of Mullite, Silicon Carbide, Graphite and/or Ceramic. In one embodiment, the heating tube is made from an impermeable material. In one embodiment, the heating tube is placed inside a sleeve. In one embodiment, the sleeve is made of impermeable material. In one embodiment, the heating tube is comprised of an upper portion and a lower portion wherein the upper portion is opposite to the lower portion wherein only the upper portion has an opening to allow the vapor and carrier gas mix to escape. In one embodiment, the sleeve surrounds the heating tube and is comprised of an upper portion and a lower portion wherein the lower portion faces the substrate and has a number of outlets and the upper portion of said sleeve is opposite to the lower portion wherein the internal side of the upper portion of said sleeve faces the opening in the upper side of the heating tube. In one embodiment, the vapor and carrier gas mix escapes the heating tube through the heating-tube-opening towards the impermeable sleeve and travels in said sleeve towards the outlets in the lower portion of said sleeve, which has a number of outlets facing the substrate. In one embodiment, a filter can be added to the opening of the heating tube. In one embodiment, said filter purifies the vapor and carrier gas mix before its delivery to the substrate. In another embodiment, said sleeve can be shrouded with a narrow tube that confines the sleeve and extends all the way towards the lower side of the sleeve at which point this tube extends horizontally above the substrate with a number of outlets for streaming out the vapor/carrier gas mix onto the substrate. In one embodiment, the vapor delivered to the substrate is more pure as a result of the longer distance travelled by the vapor and carrier gas mix. In one embodiment, the thermal source is selected from the group consisting of electrical power heating, IR heating, and/or microwave heating/RF heating. In one embodiment, the heating tube has a larger perimeter than the feeder tube. In one embodiment, the heating tube and sleeves comprise a controlled environment. In one embodiment, pressure temperature, vapor pressure and carrier gas flow are controlled and monitored within said controlled environment. In one embodiment, the transporting apparatus is comprised of a conveyor belt.

In a third aspect of the invention, an apparatus for deposition of a plurality of elements or compounds onto a solar cell substrate is disclosed comprising: providing a substrate; providing one or more elements or compounds for deposition on the substrate; providing a housing; providing a transporting apparatus to transport the substrate in and out of the housing; placing the substrate onto the transporting apparatus and having the transporting apparatus transport the substrate into the housing; providing one or more tubing apparatus to deliver powders of the elements or compounds to the housing wherein the tubing apparatus is comprised of one or more feeder tubes located outside of the housing and joined to the housing; a plurality of source material tubes located outside of the housing and joined to the feeder tube; a plurality of valves located inside of the source material tubes sufficient to block access between the source material tubes and the feeder tubes; one or more heating tubes located inside of the housing and connected to the feeder tubes; placing the elements or compounds into the source material tubes; opening the valves to allow the elements to move into the feeder tubes; providing a portion of carrier gas and feed the carrier gas into the feeder tubes; allowing the carrier gas to carry the elements or compounds from the feeder tubes into the heating tubes; providing one or more thermal sources to heat the housing and the heating tube and vaporizing the elements and/or compounds inside the heating tubes and allowing the elements and/or compounds to leave the heating tubes in vapor phase; allowing the elements or compounds to deposit onto the substrate after the vapors leave the heating tubes; transporting the substrate outside of the housing after the elements and/or compounds are deposited onto the substrate.

In one embodiment, the heating tube is cylindrical and tubular in form. In one embodiment, the feeder tube is cylindrical and tubular in form. In one embodiment, the heating tube is rectangular in form. In one embodiment, the feeder tube is rectangular in form. In one embodiment, the heating tube is semi-cylindrical in form. In one embodiment, the feeder tube is semi-cylindrical in form.

In one embodiment, the housing is made with materials selected from the group consisted of Mullite, Silicon Carbide, Graphite and/or Ceramic. In one embodiment, the controlled environment is comprised of an inner heating impermeable tube, a middle porous tube surrounding said inner tube, and an outer impermeable tube surrounding said porous middle tube. In one embodiment, said porous middle tube purifies the vapor/carrier gas mix from any powders. In one embodiment, the outer impermeable tube has a width varying slit-like slot which can be opened at the lower side of said outer tube. In one embodiment, the outer tube has a number of outlets punched in the lower end of said outer tube. In another embodiment, a separate conduit is assembled in the lower side of said outer tube in which the outlets are punched through the lower side of the conduit. In one embodiment, said slot, said outlets in the lower end of the tube and said outlets in said conduit comprise alternative pathways, through which the vapor/carrier gas mix streams out onto the substrate. In one embodiment, the thermal source is selected from the group consisting of electrical power heating, IR heating, and/or microwave heating/RF heating. In one embodiment, the heating tube has a larger perimeter than the feeder tube. In one embodiment, pressure temperature, vapor pressure and carrier gas flow are controlled and monitored within said controlled environment. In one embodiment, the transporting apparatus is comprised of a conveyor belt.

In a fourth aspect of the invention, an apparatus for deposition of a plurality of elements onto a solar cell substrate is disclosed comprising: a housing; a transporting apparatus to transport the substrate in and out of the housing; one or more tubing apparatus to deliver powders and/or gases and/or solid pieces of the elements and/or compounds to the housing wherein the tubing apparatus is comprised of one or more feeder tubes located outside of the housing and joined to the housing; a plurality of source material tubes located outside of the housing and joined to the feeder tubes; a plurality of valves located inside of the source material tubes sufficient to block access between the source material tubes and the feeder tubes; one or more heating tubes located inside of the housing and connected to the feeder tubes; a loading station for loading the substrate onto the transporting apparatus; one or more thermal sources to heat the housing and the heating tube.

In one embodiment, the feeder tubes and the heating tubes are constructed with Silicon Carbide, and/or Molybdenum disilicide (MoSi2), and/or Graphite, and/or Mullite and/or quartz, and/or another Ceramic material. In one embodiment, the heating tube is heated to a temperature between 50-2000° C. during its functional state. In one embodiment, the material source tubes provide the elements and/or compounds in powder form to the feeder tube when the valves are opened. In one embodiment, the material source tubes provide the elements or compounds in fluid form (either gas or liquid) or in the form of solid pieces to the feeder tube when the valves are opened.

In one embodiment, the feeder tubes contain carrier gas to carry the elements and/or compounds in powder form to the heating tubes inside the housing. In one embodiment, the heating tubes heat the elements and/or compounds in powder form and convert the elements and/or compounds to vapor form. In one embodiment, the carrier gas is selected from the group consisting of Helium, Nitrogen, Argon and/or Neon. In one embodiment, the heating tube is cylindrical and tubular in form. In one embodiment, the feeder tube is cylindrical and tubular in form. In one embodiment, the heating tube is rectangular in form. In one embodiment, the feeder tube is rectangular in form. In one embodiment, the heating tube is semi-cylindrical in form. In one embodiment, the feeder tube is semi-cylindrical in form. In one embodiment, the housing is made with material selected from the group consisted of Mullite, Silicon Carbide (SiC), Graphite and/or Ceramic. In one embodiment, the heating tube is made of a material that is impermeable to the vapor/carrier gas mix, but not to the elements in powder form. In one embodiment, said heating tube is comprised of an upper portion and a lower portion wherein the upper portion is opposite to the lower portion and has an opening to allow the vapor/carrier gas mix to pass through. In one embodiment, said heating tube is surrounded by an outer impermeable tube that has a lower portion and an upper portion wherein the inner side of the upper portion in said outer tube faces said opening in said heating-tube, and the lower side of said outer tube has a number of outlets to allow the vapor/carrier gas mix to pass through and stream out onto the substrate. In one embodiment, said outer impermeable tube is made of impermeable ceramic or impermeable graphite and said heating tube is made of SiC.

In one embodiment, the thermal source is selected from the group consisting of electrical power heating, IR heating, and RF and microwave heating. In one embodiment, the heating tube has a larger perimeter than the feeder tube. In one embodiment, the transporting apparatus is comprised of a conveyor belt.

In yet a fifth aspect of the invention, a method of depositing a plurality of elements and/or compounds onto a solar cell substrate is disclosed comprising: providing an apparatus for deposition of a plurality of elements onto a solar cell substrate; loading the substrate onto the transporting apparatus; providing the first elements and/or compounds to the first source material tube wherein the first elements and/or compounds are CuInGa (CIG) powders; applying a portion of first carrier gas into the first feeder tube wherein the first carrier gas carries the CIG powder into the first heating tube; heating the first heating tube thereby vaporizing the CIG powder and turning the CIG powder into CIG vapor; allowing the CIG vapor to deposit onto the substrate as the substrate is transported by the transporting apparatus to a first area nearing the first heating tube; providing the second elements and/or compounds to the second source material tube wherein the second elements and/or compounds are NaF powder; applying a portion of second carrier gas into the second feeder tube wherein the second carrier gas carries the NaF powder into the second heating tube; heating the second heating tube thereby vaporizing the NaF powder and turning the NaF powder to NaF vapor; allowing the NaF vapor to deposit onto the substrate as the substrate is transported by the transporting apparatus to a second area nearing the second heating tube; providing the third element and/or compound to the third source material tube wherein the third element is Se powder; applying a portion of third carrier gas into the third feeder tube wherein the third carrier gas carries the Se powder into the third heating tube; heating the third heating tube thereby vaporizing the Se powder and turning the Se powder into Se vapor; allowing the Se vapor to deposit onto the substrate as the substrate is transported by the transporting apparatus to a third area nearing the third heating tube.

In yet a sixth aspect of the invention, a method of depositing a plurality of elements and/or compounds onto a solar cell substrate is disclosed comprising: providing an apparatus for deposition of a plurality of elements onto a solar cell substrate; loading the substrate onto the transporting apparatus; providing the first elements and/or compounds to the first source material tube wherein the first elements and/or compounds are CuInGaSe2 (CIGS) powder; applying a portion of first carrier gas into the first feeder tube wherein the first carrier gas carries the CIGS powder into the first heating tube; heating the first heating tube thereby vaporizing the CIGS powder and turning the CIGS powder into CIGS vapor; allowing the CIGS vapor to deposit onto the substrate as the substrate is transported by the transporting apparatus to a first area nearing the first heating tube; providing the second elements and/or compounds to the second source material tube wherein the second elements and/or compounds are NaF powder; applying a portion of second carrier gas into the second feeder tube wherein the second carrier gas carries the NaF powder into the second heating tube; heating the second heating tube thereby vaporizing the NaF powder and turning the NaF powder to NaF vapor; allowing the NaF vapor to deposit onto the substrate as the substrate is transported by the transporting apparatus to a second area nearing the second heating tube.

In yet a seventh aspect of the invention, a method of depositing a plurality of elements and/or compounds onto a solar cell substrate is disclosed comprising: providing an apparatus for deposition of a plurality of elements onto a solar cell substrate; loading the substrate onto the transporting apparatus; providing the first elements and/or compounds to the first source material tube wherein the first elements and/or compounds are CuInGa (CIG) powders; applying a first portion of the carrier gas into the first feeder tube wherein the first portion of carrier gas carries the CIG powder into the heating tube; providing the second elements and/or compounds to the second source material tube wherein the second elements is Se powder; applying a second portion of the carrier gas into the first feeder tube wherein the second portion of carrier gas carries the Se powder into the heating tube, providing the third elements and/or compounds to the third source material tube wherein the third elements and/or compounds are NaF powders; applying a third portion of the carrier gas into the third feeder tube wherein the third portion of carrier gas carries the NaF powder into the heating tube; heating the heating tube thereby vaporizing the CIG powder, Se powder and NaF powder and turning the CIG powder into CIG vapor; the Se powder into Se vapor and NaF powder into NaF vapor, allowing all said vapors to deposit onto the substrate as the substrate is transported by the transporting apparatus to the area nearing the heating tube.

In yet an eighth aspect of the invention, a method of depositing a plurality of elements and/or compounds onto a solar cell substrate is disclosed comprising: providing an apparatus for deposition of a plurality of elements onto a solar cell substrate; loading the substrate onto the transporting apparatus; providing the first elements and/or compounds to the first source material tube wherein the first elements and/or compounds are (In,Ga)2Se3 (IGS) powders; applying a portion of first carrier gas into the first feeder tube wherein the first carrier gas carries the IGS powder into the first heating tube; heating the first heating tube thereby vaporizing the IGS powder and turning the IGS powder into IGS vapor; allowing the IGS vapor to deposit onto the substrate as the substrate is transported by the transporting apparatus to a first area nearing the first heating tube; providing the second elements and/or compounds to the second source material tube wherein the second elements and/or compounds are NaF powder; applying a portion of second carrier gas into the second feeder tube wherein the second carrier gas carries the NaF powder into the second heating tube; heating the second heating tube thereby vaporizing the NaF powder and turning the NaF powder to NaF vapor; allowing the NaF vapor to deposit onto the substrate as the substrate is transported by the transporting apparatus to a second area nearing the second heating tube; providing the third element and/or compound to the third source material tube wherein the third element is Cu2-xSe (0<1x<1) (CS) powder; applying a portion of third carrier gas into the third feeder tube wherein the third carrier gas carries the CS powder into the third heating tube; heating the third heating tube thereby vaporizing the CS powder and turning the CS powder into CS vapor; allowing the CS vapor to deposit onto the substrate as the substrate is transported by the transporting apparatus to a third area nearing the third heating tube.

In yet an ninth aspect of the invention, a method of depositing a plurality of elements and/or compounds onto a solar cell substrate is disclosed comprising: providing an apparatus for deposition of a plurality of elements onto a solar cell substrate; loading the substrate onto the transporting apparatus; providing the first elements and/or compounds to the first source material tube wherein the first elements and/or compounds are $Cu_{2-x}Se$ (0<1x<1) (CS) powder; applying a portion of first carrier gas into the first feeder tube wherein the first carrier gas carries the CS powder into the first heating tube; heating the first heating tube thereby vaporizing the CS powder and turning the CS powder into CS vapor; allowing the CS vapor to deposit onto the substrate as the substrate is transported by the transporting apparatus to a first area nearing the first heating tube; providing the second elements and/or compounds to the second source material tube wherein the second elements and/or compounds are NaF powder; applying a portion of second carrier gas into the second feeder tube wherein the second carrier gas carries the NaF powder into the second heating tube; heating the second heating tube thereby vaporizing the NaF powder and turning the NaF powder to NaF vapor; allowing the NaF vapor to deposit onto the substrate as the substrate is transported by the transporting apparatus to a second area nearing the second heating tube; providing the third element and/or compound to the third source material tube wherein the third element is $(In,Ga)_2Se_3$ (IGS) powders; applying a portion of third carrier gas into the third feeder tube wherein the third carrier gas carries the IGS powder into the third heating tube; heating the third heating tube thereby vaporizing the IGS powder and turning the IGS powder into IGS vapor; allowing the IGS vapor to deposit onto the substrate as the substrate is transported by the transporting apparatus to a third area nearing the third heating tube.

In yet a tenth aspect of the invention, a method of depositing a plurality of elements onto a solar cell substrate is disclosed comprising: providing an apparatus for deposition of a plurality of elements and/or compounds onto a solar cell substrate; loading the substrate onto the transporting apparatus; providing the first elements to the first source material tube wherein the first elements and/or compounds are CuGa (CG) powders; applying a portion of first carrier gas into the first feeder tube wherein the first carrier gas carries the CG powder into the first heating tube; heating the first heating tube thereby vaporizing the CG powder and turning the CG powder to CG vapor; allowing the CG vapor to deposit onto the substrate as the substrate is transported by the transporting apparatus to a first area nearing the first heating tube; providing the second elements and/or compounds to the second source material tube wherein the second elements and/or compounds are NaF powders; applying a portion of second carrier gas into the second feeder tube wherein the second carrier gas carries the NaF powder into the second heating tube; heating the second heating tube thereby vaporizing the NaF powder and turning the NaF powder to NaF vapor; allowing the NaF vapor to deposit onto the substrate as the substrate is transported by the transporting apparatus to a second area nearing the second heating tube; providing the third elements to the third source material tube wherein the third elements and/or compounds are In powder; applying a portion of third carrier gas into the third feeder tube wherein the third carrier gas carries the In powder into the third heating tube; heating the third heating tube thereby vaporizing the In powder and turning the In powder to In vapor; allowing the In vapor to deposit onto the substrate as the substrate is transported by the transporting apparatus to a third area nearing the third heating tube; providing the fourth elements to the fourth source material tube wherein the fourth elements are Se powder; applying a portion of fourth carrier gas into the fourth feeder tube wherein the fourth carrier gas carries the Se powder into the fourth heating tube; heating the fourth heating tube thereby vaporizing the Se powder and turning the Se powder to Se vapor; allowing the Se vapor to deposit onto the substrate as the substrate is transported by the transporting apparatus to a fourth area nearing the fourth heating tube.

In yet an eleventh aspect of the invention, a method of depositing a plurality of elements onto a solar cell substrate is disclosed comprising: providing an apparatus for deposition of a plurality of elements and/or compounds onto a solar cell substrate; loading the substrate onto the transporting apparatus; providing the first elements and/or compounds to the first source material tube wherein the first elements and/or compounds are Cu powders; applying a portion of first carrier gas into the first feeder tube wherein the first carrier gas carries the Cu powder into the first heating tube; heating the first heating tube thereby vaporizing the Cu powder and turning the Cu powder to Cu vapor; allowing the Cu vapor to deposit onto the substrate as the substrate is transported by the transporting apparatus to a first area nearing the first heating tube; providing the second elements and/or compounds to the second source material tube wherein the second elements and/or compounds are NaF powders; applying a portion of second carrier gas into the second feeder tube wherein the second carrier gas carries the NaF powder into the second heating tube; heating the second heating tube thereby vaporizing the NaF powder and turning the NaF powder to NaF vapor; allowing the NaF vapor to deposit onto the substrate as the substrate is transported by the transporting apparatus to a second area nearing the second heating tube; providing the third elements to the third source material tube wherein the third elements and/or compounds are Ga powders or liquid; applying a portion of third carrier gas into the third feeder tube wherein the third carrier gas carries the Ga powder into the third heating tube; heating the third heating tube thereby vaporizing the Ga powder or liquid and turning the Ga powder into Ga vapor; allowing the Ga vapor to deposit onto the substrate as the substrate is transported by the transporting apparatus to a third area nearing the third heating tube; providing the fourth elements to the fourth source material tube wherein the fourth elements and/or compounds are In powder; applying a portion of fourth carrier gas into the fourth feeder tube wherein the fourth carrier gas carries the In powder into the fourth heating tube; heating the fourth heating tube thereby vaporizing the In powder and turning the In powder to In vapor; allowing the In vapor to deposit onto the substrate as the substrate is transported by the transporting apparatus to a fourth area nearing the fourth heating tube; providing the fifth elements to the fifth source material tube wherein the fifth elements are Se powder; applying a portion of fifth carrier gas into the fifth feeder tube wherein the fifth carrier gas carries the Se powder into the fifth heating tube; heating the fifth heating tube thereby vaporizing the Se powder and turning the Se powder to Se vapor; allowing the Se vapor to deposit onto the substrate as the substrate is transported by the transporting apparatus to a fifth area nearing the fifth heating tube.

In yet a twelfth aspect of the invention, a method of depositing a plurality of elements and/or compounds onto a solar cell substrate is disclosed comprising: providing an apparatus for deposition of a plurality of elements onto a solar cell substrate; loading the substrate onto the transporting apparatus; providing the first elements and/or compounds to the first source material tube wherein the first elements and/or compounds are (In,Ga)2Se3 (IGS) powders; applying a portion of first carrier gas into the first feeder tube wherein the first carrier gas carries the IGS powder into the first heating tube; heating the first heating tube thereby vaporizing the IGS powder and turning the IGS powder into IGS vapor; allowing the IGS vapor to deposit onto the substrate as the substrate is transported by the transporting apparatus to a first area nearing the first heating tube; providing the second elements and/or compounds to the second source material tube wherein the second elements and/or compounds are NaF powder; applying a portion of second carrier gas into the second feeder tube wherein the second carrier gas carries the NaF powder into the second heating tube; heating the second heating tube thereby vaporizing the NaF powder and turning the NaF powder to NaF vapor; allowing the NaF vapor to deposit onto the substrate as the substrate is transported by the transporting apparatus to a second area nearing the second heating tube; providing the third element and/or compound to the third source material tube wherein the third element and/or compound is Cu2-xSe (0<1x<1) (CS) powder; applying a portion of third carrier gas into the third feeder tube wherein the third carrier gas carries the CS powder into the third heating tube; heating the third heating tube thereby vaporizing the CS powder and turning the CS powder into CS vapor; allowing the CS vapor to deposit onto the substrate as the substrate is transported by the transporting apparatus to a third area nearing the third heating tube resulting in a Cu-rich CIGS film; providing the fourth element and/or compound to the fourth source material tube wherein the fourth element and/or compound is (In, Ga)2Se3 (IGS) powder; applying a portion of fourth carrier gas into the fourth feeder tube wherein the fourth carrier gas carries the IGS powder into the third heating tube; heating the fourth heating tube thereby vaporizing the IGS powder and turning the IGS powder into IGS vapor; allowing the IGS vapor to deposit onto the substrate as the substrate is transported by the transporting apparatus to a fourth area nearing the fourth heating tube resulting in a Cu-poor CIGS film.

In yet a thirteenth aspect of the invention, an apparatus for deposition of a plurality of elements or compounds onto a solar cell substrate is disclosed comprising: a housing; a transporting apparatus to transport the substrate in and out of the housing; a first tubing apparatus to deliver powders of a first element or compound to the housing wherein the first tubing apparatus is comprised of a first feeder tube located outside of the housing and joined to the housing; a first source material tube located outside of the housing and joined to the feeder tube; a valve located inside of the first source material tube sufficient to block access between the first source material tube and the first feeder tube; a first heating tube located inside of the housing and connected to the first feeder tube; a second tubing apparatus to deliver powders of a second element or and/or compound to the housing wherein the second tubing apparatus is comprised of a second feeder tube located outside of the housing and joined to the housing; a second source material tube located outside of the housing and joined to the second feeder tube; a valve located inside of the second source material tube sufficient to block access between the second source material tube and the second feeder tube; a second heating tube located inside of the housing and connected to the second feeder tube; a loading station for loading the substrate onto the transporting apparatus; one or more thermal sources to heat the housing and the first heating tube and the second heating tube.

In one embodiment, the apparatus is further comprised of a third tubing apparatus to deliver powders of a third element and/or compound to the housing wherein the third tubing apparatus is comprised of a third feeder tube located outside of the housing and joined to the housing; a third source material tube located outside of the housing and joined to the third feeder tube; a valve located inside of the third source material tube sufficient to block access between the third source material tube and the third feeder tube; a third heating tube located inside of the housing and connected to the third feeder tube wherein one or more thermal sources further heats the third heating tube.

In one embodiment, the apparatus is further comprised of a fourth tubing apparatus to deliver powders of a fourth element and/or compound to the housing wherein the fourth tubing apparatus is comprised of a fourth feeder tube located outside of the housing and joined to the housing; a fourth source material tube located outside of the housing and joining to the fourth feeder tube; a valve located inside of the fourth source material tube sufficient to block access between the fourth source material tube and the fourth feeder tube; a fourth heating tube located inside of the housing and connected to the fourth feeder tube wherein one or more thermal sources further heats the fourth heating tube.

In one embodiment, the apparatus comprising a Se duct into the housing for introduction of a first portion of Se containing gas.

In yet fourteenth aspect of the invention, a method of depositing a plurality of elements and/or compounds onto a solar cell substrate is disclosed comprising: providing an apparatus for deposition of a plurality of elements onto a solar cell substrate; loading the substrate onto the transporting apparatus; providing the first elements to the first source material tube wherein the first elements are CIG powder; applying a portion of first carrier gas into the first feeder tube wherein the first carrier gas carries the CIG powder into the first heating tube; heating the first heating tube thereby vaporizing the CIG powder and turning the CIG powder to CIG vapor; allowing the CIG vapor to deposit onto the substrate as the substrate is transported by the transporting apparatus to a first area nearing the first heating tube; providing the second elements and/or compounds to the second source material tube wherein the second elements are NaF powder; applying a portion of second carrier gas into the second feeder tube wherein the second carrier gas carries the NaF powder into the second heating tube; heating the second heating tube thereby vaporizing the NaF powder and turning the NaF powder to NaF vapor; allowing the NaF vapor to deposit onto the substrate as the substrate is transported by the transporting apparatus to a second area nearing the second heating tube; providing the first portion of Se containing gas into the housing via the Se duct; allowing the Se vapor to deposit onto the substrate as the substrate is transported by the transporting apparatus to a third area nearing the Se duct. In one embodiment the Se containing gas is H2Se In yet the fifteenth aspect of the invention, a method of depositing a plurality of elements onto a solar cell substrate is disclosed comprising: providing an apparatus for deposition of a plurality of elements and/or compounds onto a solar cell substrate; loading the substrate onto the transporting apparatus; providing the first elements and/or compounds to the first source material tube wherein the first elements and/or compounds are CG powders; applying a portion of first carrier gas into the first feeder tube wherein the first carrier gas carries the CG powder into the first heating tube;

heating the first heating tube thereby vaporizing the CG powder and turning the CG powder to CG vapor; allowing the CG vapor to deposit onto the substrate as the substrate is transported by the transporting apparatus to a first area nearing the first heating tube; providing the second elements to the second source material tube wherein the second elements and/or compounds are NaF powder; applying a portion of second carrier gas into the second feeder tube wherein the second carrier gas carries the NaF powder into the second heating tube; heating the second heating tube thereby vaporizing the NaF powder and turning the NaF powder to NaF vapor; allowing the NaF vapor to deposit onto the substrate as the substrate is transported by the transporting apparatus to a second area nearing the second heating tube; providing the third elements to the third source material tube wherein the third elements are In powders; applying a portion of third carrier gas into the third feeder tube wherein the third carrier gas carries the In powder into the third heating tube; heating the third heating tube thereby vaporizing the In powder and turning the In powder to In vapor; allowing the In vapor to deposit onto the substrate as the substrate is transported by the transporting apparatus to a third area nearing the third heating tube; providing the first portion of Se containing gas into the housing via the Se duct; allowing the Se containing gas to deposit onto the substrate as the substrate is transported by the transporting apparatus to a fourth area nearing the Se duct. In one embodiment, the Se containing gas is comprised of H2Se.

In the sixteenth aspect of the invention, a method to deposit CIGS thin film for solar panel construction is disclosed comprising: providing a first chamber; providing a substrate and placing the substrate inside the first chamber; providing a metallic target wherein the metallic target is made with elements selected from the group consisting of Cu, CuGa, In, CuIn and CuInGa; placing the metallic target inside the first chamber; reducing pressure within the first chamber to a pressure of less than $1\times10^{-6}$ Torr; adding sputtering gas into the first chamber after reducing pressure within the first chamber to a pressure of less than $1\times10^{-6}$ Torr until the pressure in the chamber is increased to about 100 mTorr or less; sputtering the elements from the metallic target to the substrate; providing a second chamber; transferring the substrate from the first chamber to the second chamber after the substrate is sputtered with the elements; providing a Se vapor into the second chamber; perform vapor deposition as to allow the Se to be deposited on the substrate.

In one embodiment, the substrate is first coated with a barrier layer. In one embodiment, the barrier layer is made with elements selected from the group consisting of SiN, SiO2, SiC. In one embodiment, the substrate is further coated with a back contact layer. In one embodiment, the contact layer is made with elements selected from the group consisting of Mo, W, Nb, Ta. In one embodiment, NaF can be deposited by evaporation onto the substrate before sputtering the elements from the metallic target to the substrate. In one embodiment, the step of sputtering the element from the metallic target to the substrate is comprised of first sputtering CuGa from a CuGa target followed by sputtering In from In target wherein as a result the ration of Cu/(In+Ga) is between 0.8-1 and and the ration of Ga/(In+Ga) is between 0-1.

In one embodiment, the step of sputtering the element from the metallic target to the substrate is comprised of first sputtering CuGa from a CuGa target followed by sputtering In from In target wherein as a result the ration of Cu/(In+Ga) is between 0.8-1 and the ration of Ga/(In+Ga) is between 0-1. In one embodiment, the step of sputtering the element from the metallic target to the substrate is comprised of first sputtering In from In target followed by sputtering CuGa from a CuGa target wherein as a result the ration of Cu/(In+Ga) is between 0.8-1 and and the ration of Ga/(In+Ga) is between 0-1.

In one embodiment, the step of sputtering the element from the metallic target to the substrate is comprised of first sputtering CuGa from a CuGa target followed by sputtering CuIn from CuIn target wherein as a result the ration of Cu/(In+Ga) is between 0.8-1 and the ration of Ga/(In+Ga) is between 0-1.

In one embodiment, the step of sputtering the element from the metallic target to the substrate is comprised of first sputtering CuIn from CuIn target followed by sputtering CuGa from a CuGa target wherein as a result the ration of Cu/(In+Ga) is between 0.8-1 and the ration of Ga/(In+Ga) is between 0-1.

In one embodiment, the step of sputtering the elements from the metallic target to the substrate is comprised of first sputtering CuGa from a CuGa target wherein ratio of Cu/Ga is greater than 1, followed by sputtering CuIn from CuIn target wherein Cu/In is less than 1, wherein as a result the ration of Cu/(In+Ga) is between 0.8-0.9 and the ration of Ga/(In+Ga) is between 0-1.

In one embodiment, the step of sputtering the element from the metallic target to the substrate is comprised of first sputtering CuIn from a CuIn target wherein ratio of Cu/In is less than 1, followed by sputtering CuGa from CuGa target wherein Cu/Ga is greater than 1, wherein as a result the ration of Cu/(In+Ga) is between 0.8-0.9 and and the ration of Ga/(In+Ga) is between 0-1.

In one embodiment, the step of sputtering the element from the metallic target to the substrate is comprised of first sputtering CuGa from a CuGa target wherein ratio of Cu/Ga is less than 1, followed by sputtering CuIn from CuIn target wherein Cu/In is greater than 1, wherein as a result the ration of Cu/(In+Ga) is between 0.8-0.9 and the ration of Ga/(In+Ga) is between 0-1.

In one embodiment, the step of sputtering the element from the metallic target to the substrate is comprised of first sputtering CuIn from a CuIn target wherein ratio of Cu/In is greater than 1, followed by sputtering CuGa from CuGa target wherein Cu/Ga is less than 1, wherein as a result the ration of Cu/(In+Ga) is between 0.8-0.9 and the ration of Ga/(In+Ga) is between 0-1.

In one embodiment, the step of sputtering the element from the metallic target to the substrate is comprised of simultaneously sputtering CuIn from a CuIn target; and sputtering CuGa from CuGa target wherein as a result the ration of Cu/(In+Ga) is greater than 1 and the ration of Ga/(In+Ga) is between 0-1.

In one embodiment, the step of sputtering the element from the metallic target to the substrate is carried out at room temperature. In one embodiment, the step of sputtering the element from the metallic target to the substrate wherein the substrate is heated to a temperature of less than 500° C. In one embodiment, the substrate is heated by a method selected from the group consisting of Resistive/electrical heating, Infra-red (IR) heating, RF heating, and Microwave heating.

In one embodiment, the step of sputtering the elements from the metallic target to the substrate is further comprising subjecting the substrate in planar motion as the element is sputtered onto the substrate.

In one embodiment, the step of sputtering the elements from the metallic target to the substrate is further comprising subjecting the substrate facing down as the elements are sputtered onto the substrate. In one embodiment, the step of sputtering the element from the metallic target to the substrate is further comprising subjecting the substrate facing up as the element is sputtered onto the substrate.

In one embodiment, the step of sputtering the element from the metallic target to the substrate is further comprising sputtering the elements from the metallic target to the substrate until the elements on the substrate is approximately 2.5 μm in thickness.

In one embodiment, portion of Copper Sulfide (CuxS) is sputtered onto to the substrate after the step of sputtering the elements from the metallic target to the substrate.

In the seventeenth aspect of the invention, a method to deposit CIGS thin films for solar panel construction comprising: providing a first chamber; providing a CIG (Cu, In, Ga)/(back-contact)/(barrier layer)/(substrate) structure and placing the structure inside the first chamber; providing a thermal source for the substrate and heating the substrate using the thermal source; providing a Se source; providing a thermal source for Se and heating the Se source using the thermal source, thereby the Se evaporates to Se vapor and flows to the substrate thereby depositing onto the (CIG)/(back-contact)/(barrier layer)/(substrate) structure and starting reacting with Cu, In and Ga to form CIGS. In one embodiment, the thermal source for the substrate is selected from the group consisting of resistive heating, IR heating, and RF/microwave heating. In one embodiment, the substrate is heated to a temperature range between 400-800° C. In one embodiment, the resistive heating, IR heating, and RF/microwave heating is comprised of placing a susceptor next to a first surface of the substrate wherein the first surface of the substrate is opposite to a second surface of the substrate wherein the second surface of the substrate is coated with (barrier layer)/(back contact)/(CIG layer) where the CIG layer is facing the Se source. In one embodiment, the susceptor is made from elements selected from the group consisting of graphite or Silicon Carbide-SiC. In one embodiment, the method further comprises annealing the (CIG)/(back contact layer)/(barrier layer)/(substrate) structure with a portion of $H_2$ to remove byproduct. In one embodiment, the byproduct is comprised of oxygen and water. In one embodiment, the step of annealing the CIG layer with a portion of $H_2$ to remove byproduct is performed between the temperature range of 50-800° C. In one embodiment, the step of annealing the CIG layer with a portion of $H_2$ to remove byproduct is performed in the time period between 1 to 10 minutes. In one embodiment, the method comprising annealing the CIG layer with a portion of $H_2$ at the same time the Se vapor starts reacting with the CIG layer in order to allow a uniform selenization of the CIG layer. In one embodiment, the method further comprises adding a portion of Nitrogen gas and a portion of Hydrogen gas at the same time as annealing the CIG layer. In one embodiment, the Nitrogen gas can be replaced with a portion of Argon gas.

BRIEF DESCRIPTION OF THE DRAWINGS

These and other features and advantages of the invention will not be described with reference to the drawings of certain preferred embodiments, which are intended to illustrate and not to limit the invention, and in which.

DETAIL DESCRIPTION OF THE INVENTION

Figure 1:
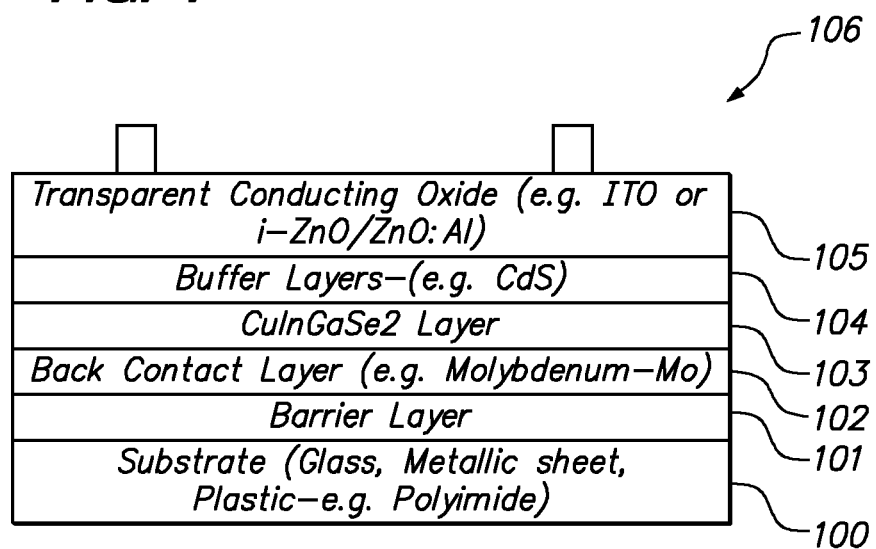
FIG. 1 is a schematic diagram illustrating a typical CIGS solar cell structure, including a CIGS thin film deposited on a number of substrates.

The following detailed description of the preferred embodiments presents a description of certain specific embodiments as examples of a plurality of ways to practice this invention. As such, one may practice the present invention in a multitude of different embodiments as defined and covered by the claims.

In some instances, certain features are described in less or more detail. The level of detail associated with each of the elements or features should not be construed to qualify the novelty or importance of one feature over the others.

Certain marks referenced herein may be trademarks, whose use is to provide an enabling disclosure by way of example and shall not be construed to exclusively limit the scope of the disclosed subject matter to material associated with such marks.

References in this specification to "an embodiment", "one embodiment", "one or more embodiments" or the like, simply mean that the particular element, feature, structure or characteristic being described is in at least one embodiment of the disclosed subject matter. The occurrences of such phrases do not necessarily refer to the same embodiment, nor do they necessarily to mutually exclusive embodiments with respect to the discussed features or elements.

In the present invention, a method and apparatus for depositing CIGS thin films and other materials are described. At ambient temperature (RT), Cu, In and Se have solid phases, whereas Ga has a liquid phase. There are multiple ways to deposit CIGS thin films on glass sheets (rigid or flexible), metallic sheets or plastic sheets (e.g. Polyimide). As described in Approach I as stated the background section, Physical Vapor Deposition (PVD) (either evaporation or sputtering) can be used to deposit CIGS on the different substrates.

Sodium acts as a dopant for CIGS and it is required to be introduced regardless of the CIGS deposition method used. Na can be introduced through Soda Lime Glass (SLG) in case this substrate is used. For other substrates such as metallic sheets, plastic sheets and Na-free glass substrates, Na can be introduced by using a source material (e.g. NaF) which can be deposited as a separate layer before depositing CIGS thin film, or in-situ deposition (by evaporation or sputtering) during the CIGS deposition process. The substrate can be flexible glass sheets (e.g. Corning® Willow™ Glass), or rigid glass sheets or metallic sheets or plastic sheets. In reference to FIG. 1, A barrier layer 101 (e.g. Silicon Dioxide-SiO2, Silicon Carbide-SiC, or Silicon Nitride-SiN) can be deposited on a cleaned-substrate 100 using PVD or other methods, followed by depositing the back contact layer 102 (e.g. any refractory metal such as: Molybdenum (Mo), Tungsten (W), Niobium (Nb), Tantalum (Ta), etc.) by DC magnetron sputtering.

Specifically, in the present invention, there is a number of methods to deposit the CIGS layer 103 on 102/101/100. To complete the CIGS solar cell, a buffer layer 104 can be deposited by a number of methods (e.g. Chemical Bath Deposition-CBD, Physical Vapor Deposition-PVD, etc.), followed by the deposition of an intrinsic layer (e.g. i-ZnO); followed by the deposition of a Transparent Conducting Oxide layer 105 (e.g. ITO or Al—ZnO); followed by depositing the metal grids and anti-reflecting coating layers 106.

I. Method 1

In one embodiment, the method utilizes sputtering as the deposition method for depositing CIGS thin films on 102/101/100 structure as depicted in FIG. 1. Referring to FIG. 1, Cu, CuGa, In, CuIn and/or CuInGa sputtering metallic targets can be used to deposit the Cu, In and Ga metals and/or their alloys on 102/101/100 structure such that Cu/(In+Ga) ratio ranges from 0.80-1 and Ga/(In+Ga) ranges from 0-1. Several combinations of sputtering targets can be used to deposit the metallic structure (elemental metals and/or their alloys) on the different substrates and achieve these ratios. In one embodiment, a small amount of NaF (specifically less than 500 Å) can be deposited on top of the 102 layer by sputtering or evaporation. In another embodiment, NaF can also be deposited between the different sputtered layers. The sputtering system should have adequate pressure levels (less than 100 mTorr) to achieve high quality sputtering.

Figure 2:
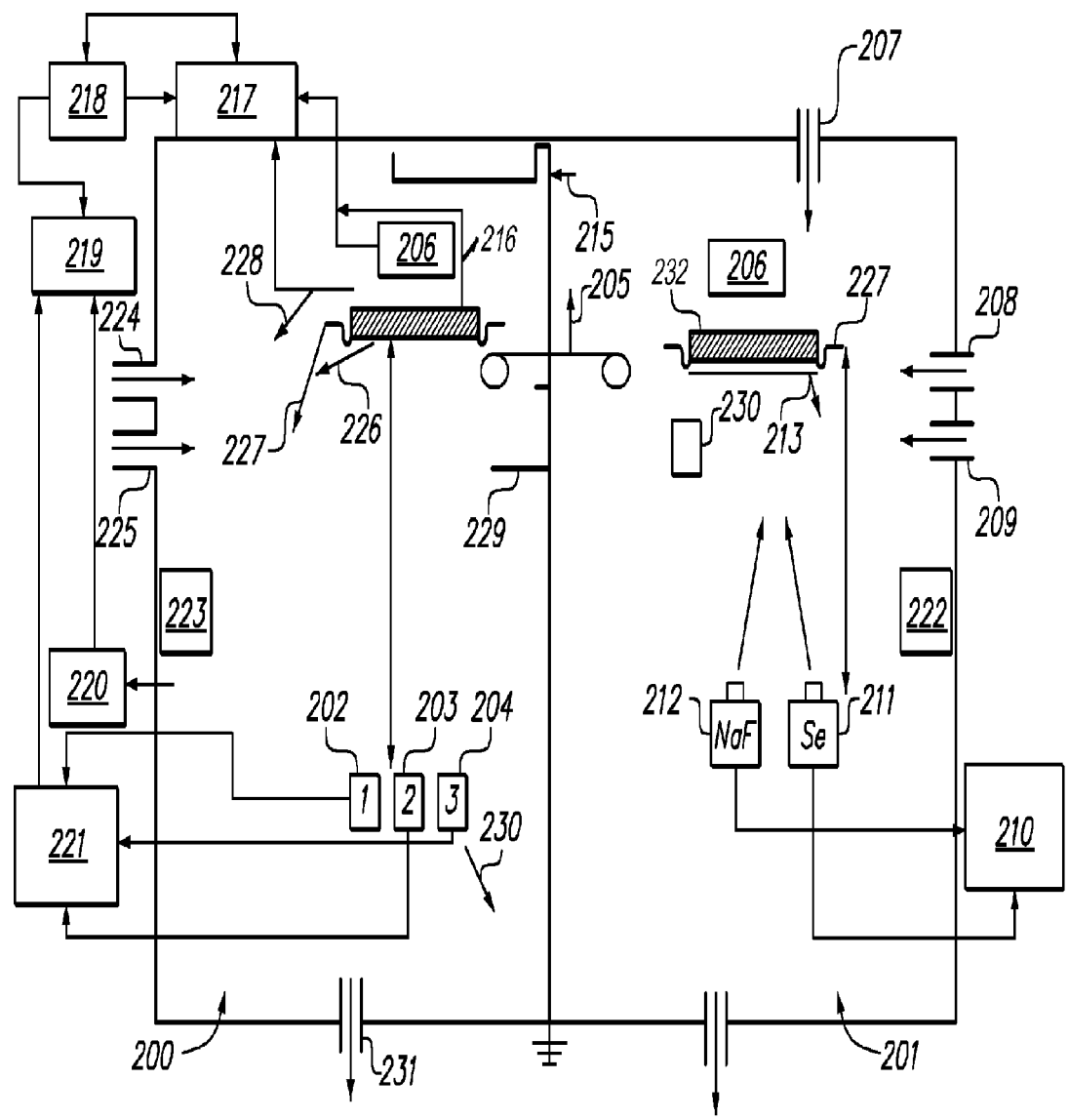
FIG. 2 is a schematic diagram illustrating a Sputtering Chamber for depositing Cu, In, Ga, and their metallic alloys; and a Selenization Chamber for Selenizing the Cu, In, Ga, and their metallic alloys.

Referencing to FIG. 2, the diagram depicts a sputtering apparatus of present invention, comprising a sputtering chamber 200 and a selenization chamber 201. Specifically, in one embodiment, the sputtering chamber 200 is comprised of a power source 218 which is linked to a computer system 219 which also is linked to measurement controls 217 that controls the heater 206 and monitors temperature 216 and to that effect activates the heater 206 to control the temperature 228. In one embodiment, the sputtering chamber 200 is also comprised of a vacuum pump which is linked to the computer system 219 which controls the environment 223 at pressure of less than 100 m Torr. An electrical power source 221 is also provided which is linked to the computer system 219 which provides power to sputter the sputtering targets 230 which in one embodiment is at least comprised of target 1 of In 202, target 2 of Cu 203 and target 3 of Cu(In)Ga 204. In addition, the sputtering chamber 200 is also comprised of various inlets including inlet 224 which allows for sputtering gas 224 to come in. In one embodiment, the sputtering gas can be Ar, Other inlet is also included such as inlet 225 that allows N2 gas to come in and inlet 231 which provides for excess gas to escape. In another embodiment, the sputtering chamber is also comprised of a gate 215 which allows for gate to open or close wherein when the gate 215 is opened substrate 226 can be transferred on the conveyer 205 from sputtering chamber 200 to the selenization chamber 201. The substrate 226, in one embodiment can be comprised of 102/101/100. In one embodiment, a susceptor 232 can be placed on the substrate 226. Also in chamber 200 is a conveyer belt 205 which can carry the substrate 226 from sputtering chamber to the selenization chamber 201. In one embodiment, the sputtering 206 chamber also incorporates a shield 229 the separates the sputtering targets 230 from the substrates 226.

In another embodiment, the selenization chamber 201 is linked to the sputtering chamber at least by the conveyer belt 205. In the selenization chamber 201 is another heater which controls the environment 222. The chamber 201 also has inlet 207 allowing N2 gas to flow in, 208 for H2 gas to flow in and 209 for H2Se gas to flow in. Also included in the chamber 201 is another electrical source 210 for powering on Se source 211 to selenize the substrate 226 and for powering on the dopant NaF source 212 to dope the Cu, In, Ga, Se structure already deposited on the substrate 226. Further the chamber is comprised of a shutter 213 which, when opened, allows the substrate 226 to be selenized.

In one embodiment, after the deposition of the metals and/or their alloys (with total thickness less than 2.5 µm), the structure with the deposited metallic precursors is transferred using a conveyer 205 from the sputtering chamber 200 to the selenization chamber 201 for selenization. Selenization chamber 201 can also be used to deposit NaF by evaporation. In one embodiment, NaF can also be deposited in the sputtering chamber 200. DC magnetron sputtering can be used to sputter all Cu, In, Ga metals and their alloys.

Moreover, still referencing to FIG. 2, target 1 202 of In, target 2 203 of Cu and/or target 3 204 of Cu(In)Ga can be replaced by other targets that already have Se. Examples of these Se containing targets are: CuxSe, (In,Ga)xSe3, In2Se3, Ga2Se3, CuInSe2, and/or CuInGaSe2. Since these targets are metallic, RF sputtering can be used. The 102/101/100 substrate structure 226 needs to be heated during the deposition of Cu, In, Ga and/or Se elements and/or their alloys and/or their compounds to temperatures greater than 400° C. to achieve the formation of Chalcopyrite CIGS structure from which thin film solar cells can be made.

Following is a summary of different embodiments of present invention wherein different procedures for depositing CuInGaSe2 (CIGS) thin films on glass (whether rigid or flexible) metallic sheets or plastic sheets (e.g. Polyimide) substrates are disclosed:

1. In one embodiment, Layer 101 can be a barrier layer (e.g. SiN, SiO2, SiC, etc.) that prevents the diffusion of impurities into the CIGS film. Layer 101 can be deposited by PVD or CVD or any other method. On top of layer 101, a back contact layer 102 of less than 1.5 µm thickness (e.g. any refractory metal such as: Molybdenum (Mo), Tungsten (W), Niobium (Nb), Tantalum (Ta), etc.) can be deposited by DC magnetron sputtering. In reference to FIG. 2, the 102/101/100 structure is then loaded into the sputtering chamber. The system is then pumped down to low pressure ($<1\times10^{-6}$ Torr). The sputtering gas (e.g. Ar) is then flown into the chamber until the pressure reaches about 100 mTorr or less (typically 30 mTorr).
2. In one embodiment, Sodium Floride (NaF) thickness of less than 500 Å can be deposited (by evaporation for example) prior to the deposition of the metals on top of the back contact layer (102).
3. In one embodiment, Cu, In, Ga and/or their alloys can be deposited on top of the NaF layer, referring to FIG. 2: this step of the process maybe achieved using the following different combinations:
   3.1. Sputter CuGa from a CuGa target followed by In from In target such that Cu/(In+Ga) and Ga/(In+Ga) ratios range from 0.8-1 and from 0-1, respectively. Total thickness for metallic precursor is less than 2.5 µm.
   3.2. Sputter In from In target followed by CuGa from a CuGa target such that Cu/(In+Ga) and Ga/(In+Ga) ratios range from 0.8-1 and from 0-1, respectively. Total thickness for metallic precursor is less than 2.5 µm.
   3.3. Sputter CuGa from a CuGa target, followed by sputtered CuIn from CuIn target such that Cu/(In+Ga) and Ga/(In+Ga) ratios range from 0.8-1 and from 0-1, respectively. Total thickness for metallic precursor is less than 2.5 µm.
   3.4. Sputter CuIn from a CuIn target, followed by sputtered CuGa from CuGa target such that Cu/(In+Ga) and Ga/(In+Ga) ratios range from 0.8-1 and from 0-1, respectively. Total thickness for metallic precursor is less than 2.5 µm.
   3.5. Sputter CuGa from a CuGa target such that Cu/Ga>1, followed by sputtering CuIn from a CuIn target such that Cu/In is <1 so that the final Cu(In+Ga) is <1 (in the range of 0.80-0.90) and the final Ga/(In+Ga) ratio is the 0-1 range. Total thickness for metallic precursor is less than 2.5 µm.
   3.6. Sputter CuIn from a CuIn target such that Cu/In<1, followed by sputtering CuGa from a CuGa target such that Cu/Ga is >1 so that the final Cu(In+Ga) is <1 (in the range of 0.80-0.90) and the final Ga/(In+Ga) ratio is in the 0-1 range. Total thickness for metallic precursor is less than 2.5 µm.
   3.7. Sputter CuGa from a CuGa target where Cu/Ga<1, followed by sputtering CuIn from a CuIn target where Cu/In is >1 so that the final Cu(In+Ga) is <1 (in the range of 0.80-0.90) and the final Ga/(In+Ga) ratio is the 0-1 range. Total thickness for metallic precursor is less than 2.5 µm.
   3.8. Sputter CuIn from a CuIn target where Cu/In>1, followed by sputtering CuGa from a CuGa target where Cu/Ga is <1, so that the final Cu(In+Ga) is <1 (in the range of 0.80-0.90) and the final Ga/(In+Ga) ratio is in the 0-1 range. Total thickness for metallic precursor is less than 2.5 µm.
   3.9. Co-sputter CuGa, CuIn, CuInGa, Cu and/or In such that Cu/(In+Ga) is slightly greater than 1 and Ga/(In+Ga) ratio is anywhere from 0-1. Selenize this structure as described below. The film in this case is slightly Cu-rich. Deposit a thin layer of In in order to bring the Cu/(In+Ga) to less than 1 (0.80-0.90), then selenize again as described below.
   3.10. The substrate temperature for all steps in 3.1-3.9 above is ambient temperature. In other words, there is no intentional heating.
   3.11. Same as 3.1-3.10 above, but with the substrate heated to a substrate temperature of less than 500° C. and greater than ambient temperature. Resistive/electrical heating or Infra-red (IR) heating can be used to heat the substrate. RF/Microwave heating can also be used.
   3.12. Same as 3.1-3.11 above but the substrate structure 102/101/100 is in planar motion to achieve better composition uniformity.
   3.13. In all the steps 3.1-3.12, the substrate structure 102/101/100 is facing down and the sputtering direction is up. All depositions will be on layer 102 that faces the targets.
   3.14. Same as 3.1-3.13, but the substrate is now facing up and the sputtering direction is downward.
4. In one embodiment, once the desired thickness of the Cu, In, Ga and their metallic alloys is achieved (less than 2.5 m), electrical power 221 on the respective targets can be turned off
5. In one embodiment, the sputtering and the selenization chambers depicted in FIG. 2 can be pumped down to less than $1 \times 10^{-6}$ Torr pressure.
6. In one embodiment, N2 gas flow rate in the sputtering chamber 200 and the selenization chamber 201 depicted in FIG. 2 can be adjusted in such away that the selenization chamber 201 has lower pressure. This must be done before opening the gate so that no Se moves into the sputtering chamber 200.
7. In one embodiment, the gate 215 can be opened. It is important to keep the pressure in the sputtering chamber 200 greater than the pressure in the selenization chamber 201.
8. In one embodiment, the [(Cu,In,Ga)/102/101/100] structure with the substrate being glass (whether rigid or flexible) or metallic sheet or plastic sheet can be transferred using the conveyer 205 shown in FIG. 2 from the sputtering chamber to the selenization chamber. After the [(Cu,In,Ga)/102/101/100] structure is transferred, then the gate 215 can be closed.
9. In one embodiment, the [(Cu,In,Ga)/102/101/100] structure can be selenized using Se vapor arriving at the [(Cu,In,Ga)/102/101/100] structure from the Se source (open boat or crucible) using the following procedures. Na can also be deposited by thermal evaporation in selenization chamber 201. Se and NaF can also be deposited by sputtering.
   9.1. The power of Se thermal source can be turned on. As a result Se vapor will start flowing towards the (Cu,In,Ga) layer precursor that has been deposited on the 102/101/100 structure. Some time needs to be waited to stabilize Se deposition rate.
   9.2. The 102/101/100 structure can be heated using resistive heating or IR heating or RF and Microwave heating until 102/101/100 structure reaches the CIGS crystallization temperature which is greater than 400° C.
   9.3. Resistive heating can be achieved by placing a susceptor 227 (e.g. graphite or SiC) on the back of the 102/101/100 substrate structure 226 and heat will then transfer to the layers 101 and 102. Alternatively, IR heating can also be used with or without a susceptor 227 on the back of the substrate S. RF and Microwave heating can also be used with and without a susceptor 227. With no susceptor 227, the RF and Microwaves will heat the glass since it's a dielectric. A RF and Microwave heating method for forming CIGS thin films as disclosed by Abushama in provisional invention application no. 61773984 can also be used. The method disclosed in the aforementioned invention application can be used to heat the metals and/or the dielectrics. This method will help obtain uniform composition, especially for Ga. A susceptor 227 on the back of the 102/101/100 substrate structure 226 can also be used for RF and Microwave heating.

9.4. The susceptor 227 can be graphite or Silicon Carbide-SiC which is an excellent absorber of RF and Microwaves.

9.5. Once Se deposition rate and the temperature of the [(Cu,In,Ga) precursor/102/101/100] structure are both stabilized to the targeted values, then the shutter 213 can be opened and the Cu,In,Ga precursor can be fully selenized after which a CIGS thin film with large grains and good material properties is formed. The target Cu/(In,Ga) ratio is 0.80-1 and the Ga/(In+Ga) ratio ranges from 0-1.

10. In another embodiment to 9 above, the [(Cu,In,Ga) precursor/102/101/100] structure can be selenized using Se vapor arriving at the [(Cu,In,Ga)/102/101/100] structure from the Se source (open boat or crucible), along with Hydrogen gas at a temperature in the range of 50-800° C. The heating methods mentioned in 9 above can be used. Once the [(Cu,In,Ga)/102/101/100] structure is loaded in Chamber 201 as shown in FIG. 2, and heated to the targeted temperature then the [Cu,In,Ga] precursor can be selenized using the following steps:

10.1. The [(Cu,In,Ga)/102/101/100] can be annealed with H2 to remove any oxygen and form water vapor as a byproduct. The temperature in this case can range from 50-700° C. for a time ranging from 1-10 mins.

10.2. While keeping the H2 gas running, the Se source can be turned on. This step will allow the selenization of the [Cu,In,Ga] precursor to start and will also allow the formation of H2Se. Both Se vapor and H2Se will selenize the metallic precursor and convert it into a CuInGaSe2 absorber. In other words, passing Hydrogen forming gas through Se vapor will cause the formation of H2Se which is used to uniformly selenize the metallic [Cu, In, Ga] precursor. H2Se allows a more uniform selenization of the metallic structure under vacuum and/or under atmospheric pressure.

10.3. A mix of Nitrogen gas (or Argon gas) and Hydrogen gas can also be used as shown in FIG. 2.

10.4. Se can be turned on/off, Hydrogen gas can also be turned on/off, and/or N2/Ar gases as depicted in FIG. 2 can be turned on/off as needed until a high quality grain morphology and high device efficiency are achieved.

10.5. The above steps in 10.1-10.4 presents a sequential process for selenizing the metallic structure using Hydrogen gas, Se gas, Nitrogen gas and/or Argon gas.

10.6. Alternative to 10.1-10.5 above, H2Se can be used from an H2Se source.

II. Method 2

Moreover, evaporation can also be used to prepare CIG(S)S thin films. Evaporation sources can be: CuGa, In, Ga, CuInGa, Se, CuxSe, (In,Ga)2Se3, In2Se3 and/or Ga2Se3. All steps described in Method 1 above for preparing the metallic [(Cu,In,Ga)/102/101/100] can be applied herein with the exception that the [Cu,In,Ga] precursor is now prepared by evaporation in a closed system that has high vacuum (less than $1 \times 10^{-6}$ Torr) with Cu/(In+Ga) and Ga/(In+Ga) ratios of 0.80-1 and 0-1, respectively. Consistent with previous notation, [(Cu,In,Ga)/102/101/100] is collectively referred as the substrate structure 226. During CIGS deposition, 226 needs to be heated to a temperature capable of crystallizing CIGS and forming the chalcopyrite structure from which high efficiency solar cells can be made. All selenization procedures described in Method 1 above can also be applied in Method 2. In-situ selenization can also be applied. In this case, Se vapor (or H2Se gas) can be introduced simultaneously or sequentially with the metals and/or their alloys onto the heated 102/101/100 substrate structure 226. 226 can be heated to 400-800° C. The substrate to source distance can range from 2 mm to 40 cm. A bill jar system can be used for the larger distances, but a tool of different design needs to be used for the smaller distances.

III. Method 3

Another method that can be used includes sulfur. In this method, CuxS (0<x<1) is sputtered on top of Cu, In, Ga structure (whether prepared by Method 1 or Method 2 above). The structure is then transferred to the selenization chamber for selenization/sulfurization using the following scheme:

A layer of Copper Sulfide (CuxS) can be sputtered or evaporated on top of the [Cu, In, Ga] structure (whether prepared by Method 1 or Method 2 above), the structure can then be annealed at a temperature greater than 200° C. using Nitrogen gas for a short time. After that, the same structure can be annealed using the sequential H2, Se, N2/Ar process described above with and without the presence of Nitrogen gas until the structure is completely converted into CuInGaSSe2 thin film of less than 5 µm thickness. This anneal step can be implemented at a temperature greater than 400° C. with a fast temperature ramp rate. Following this step, the structure can be annealed at high temperature in the presence of Nitrogen gas for a period of time less than 2 hours.

IV. Method 4

The object of this method is to present an apparatus and process for making CIGS thin films (103 in FIG. 1). The other layers: 101, 102, 104, 105 and 106 as shown in FIG. 1 can also be made using the same method. This method is capable of making CIGS thin film solar cells shown in FIG. 1 to generate electrical power at low cost. This method is also capable of making high quality materials (e.g. CIGS) from which small area and large area solar cells can be made.

The above objectives can be achieved by establishing a controlled, contained and monitored environment heated steadily and uniformly during the processing to a temperature that is capable of maintaining the vapor phase for a material from the time it vaporizes to the time its vapor condenses on the substrate or reacts with another material that has been already deposited on the substrate. The source material can be liquid, solid or gas. In the case of solid phase, the source material can be powder or small pieces. This invention also presents the use of pressure differential, mechanical design, carrying gas, forming gas and/or selenizing gas to achieve directing the vapor to the substrate on which the material will be deposited. Moreover, this invention also provides a method of delivering pure vapor material (i.e. free of any solid particles that may originate from the source material) of the source material that is capable of making high quality thin films. The temperature of the vapor surroundings and environment should be capable of keeping the material in its vapor phase from the time it vaporizes until the time it condenses on the substrate. Generally, different materials sublime at temperatures below their melting points at which temperature material starts vaporizing. For example, Selenium (Se) melts at a temperature of ~221° C. and sublimes at a temperature lower than that. In reference to FIG. 3, the 102/101/100 substrate structure will be referred to as the substrate 300. Generally, the CIGS absorber layer forms at a temperature in the range of 300-800° C. Therefore, the contained environment can be kept at the adequate temperature to maintain the vapor phase of the material to be deposited from the moment it vaporizes to the moment it condenses on substrate 300.

Figure 3:
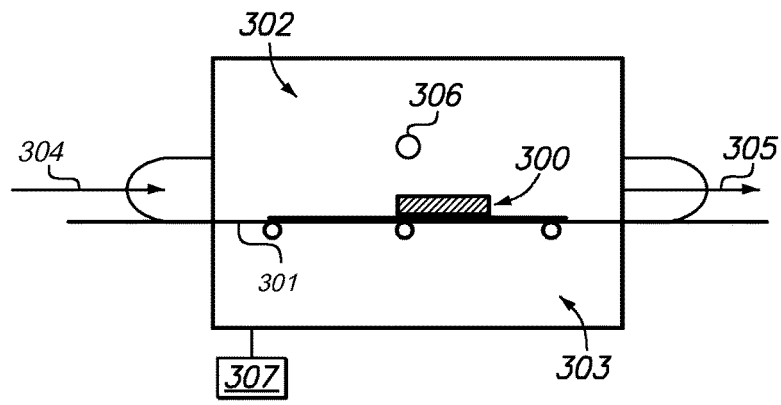
FIG. 3 is a schematic diagram illustrating a general view of the apparatus of a deposition system for depositing a material on a substrate.

Still referencing FIG. 3, the schematic diagram illustrates an overview of one embodiment of the apparatus of this method. In this schematic diagram, the substrate 300 which can be rigid or flexible glass sheets or flexible metallic or plastic sheets can be conveyed on a conveyer (or a belt) 301 to the deposition zone where vapor flows towards the substrate 300 on which vapor condenses to form a film. Unless mentioned otherwise, in this method, a layer of NaF (less than 500 Å) is deposited on substrate 300. The housing 302 can be heated to maintain the material in its vapor phase until it condenses on the substrate 300. This heated chamber 303 can be controlled, monitored and maintained to the required temperature and is referred to herein as the "controlled environment". The load locks 304, 305 are means to load/unload the substrate using a conveyer 301. In addition, a vacuum pump 307 can maintain the proper pressure within the chamber 303. The heating tube and distribution assembly (HTDA) 306 is configured in such away to deliver vapor to the substrate. The heating tube of the HTDA 306 can be made from Silicon Carbide (SiC). The distribution assembly of HTDA 306 can be made from different materials (examples include Mullite, Graphite, Ceramic, SiC, etc.)

Further, this invention also discloses a method for making CuInGaSe2 (CIGS) thin films on a substrate which can be glass (rigid or flexible), metallic sheets or plastic sheets (e.g. Polyimide).

Figure 4:
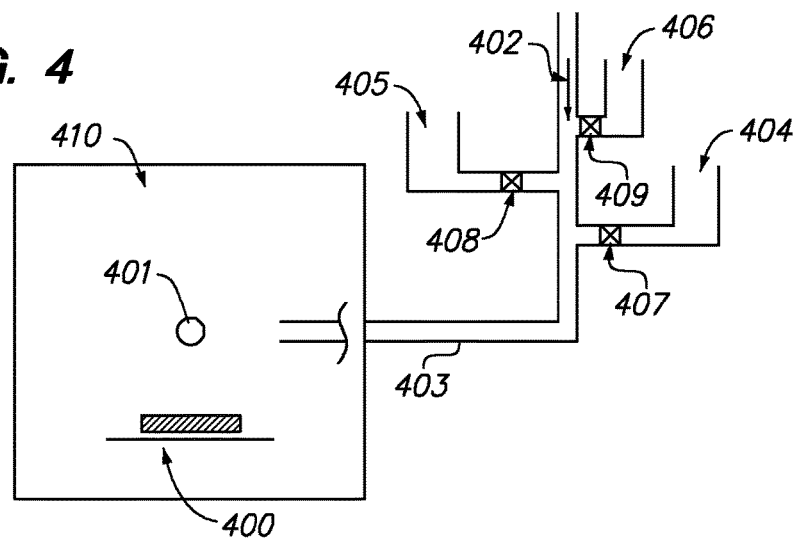
FIG. 4 is a schematic diagram illustrating a deposition system for depositing CIGS thin films on substrate.

Referring to FIG. 4, the schematic diagram illustrates the method for making CIGS thin films on a substrate 400, comprised of 102/101/100. The heating tube and distribution assembly (HTDA) 401 can have different designs and structures. The carrier gas 402 is delivered through the feeder tube 403. Source material 404, source material 405, and source material 406 are controlled by valve 407, valve 408, and valve 409, respectively. The source material 404 can be CuInGa (CIG) powder with Cu(In+Ga) ranging from 0.80-1.0 and Ga/(In+Ga) ratio ranging from 0-1. The source material 405 can be Selenium (Se) powder. The purpose of valve 407 and valve 408 is to allow the passage of material when opened and prevent the passage of the material when closed. The carrier gas 402 is to assist in directing the powder into the heating tube 401. In other words, the carrier gas 402 and the CIG powder will be directed to the heating tube 401 that is heated to a temperature capable of heating the CIG powder and vaporizing it. To control the amount of powder coming from the source materials 404, 405, and 406, a rotating screw or a vibratory feeder can be used. The heating tube 401 can be made of Silicon Carbide (SiC) and can be heated using electrical resistive heating. In this heating method, the ends of the heating SiC heating tube 401 (which is a good conductor) can be connected to an electrical power source which causes current to flow in the tube causing it to heat. Alternatively, the SiC heating tube 401 can be heated using Infra-Red (IR) heating or RF and Microwave and RF heating (EMH). SiC is a very good absorber of EMH and therefore heating the heating tube 401 using EMH can be advantageous in this case as disclosed by Abushama in provisional patent application No. 61/773,984. The heating tube and distribution station 401 and the substrate 400 are housed in the housing 410; which is controlled and monitored (referred to as "Controlled Enironment"). A number of approaches and designs can be used to achieve heating/vaporizing the material to be deposited and maintaining it in vapor phase, and then directing it towards the substrate 400 for deposition.

Figure 5:
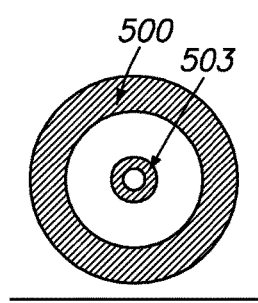
FIG. 5 is a schematic diagram illustrating cross sectional top views of a tubular, rectangular, and hemicylindrical designs of the heating tubes and vapor distribution stations.
Figure 5:
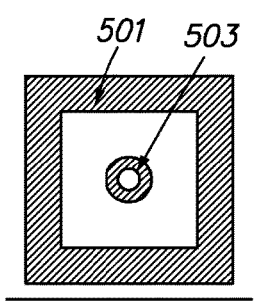
Figure 5:
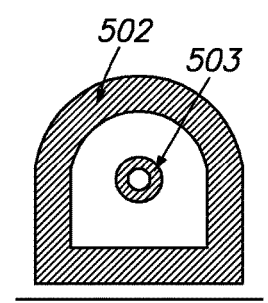

In one embodiment, referring to FIG. 5, the schematic diagram illustrates a cross sectional top views of a tubular 500, rectangular 501, and hemicylindrical 502 designs of the heating tubes, and feeder tubes 503. These are just examples and this invention extends to other shapes and structures.

Referring back to FIG. 4, the heating tube 401 is then housed in another chamber which can be another tube made from the same or another material. Furthermore, the heating tube is penetrable by the vapor and carrier gas 402 but not by the powder. The heating tube 401 and distribution assembly (HTDA) can be heated to a temperature ranging from 50-2000° C. depending on the material to be vaporized. The carrier gas 402 can be Helium, Nitrogen, Neon, etc. Once the CIG powder/carrier gas are fed through the feeder tube 403 into the heating tube 401, then CIG starts vaporizing. Once in the heating tube 401, CIG powder vaporizes and forms a mix with the carrier gas 402 until the target mix between the two is achieved. The temperature of the heating tube 401 and distribution station is monitored by thermocouples and thermowells. The vapor to carrier gas 402 ratio is crucial in achieving uniform and good deposition on the substrate 400. To prevent the back flow of CIG powder/gas into the feeder tube 403, the flow of carrier gas 402 is kept at a rate that is capable of keeping the CIG vapor and powder inside the heating tube 401. Since the heating tube 401 is penetrable, then vapor/carrier gas mix can be directed towards the substrate 400 to form a CIG precursor on the substrate 400.

Referring to FIG. 5, in case a tubular heating tube 500 is used, the vapor/carrier gas mix can penetrate the lower side of the permeable tube through which vapor will stream out towards the substrate causing deposition of CIG vapor on the substrate. This tubular design of the heating permeable tube achieves more uniform deposition on a moving substrate compared with a stationary substrate. The other two designs, rectangular and hemicylindrical heating tubes 501 and 502, respectively, both have rectangular lower sides which can also achieve uniform deposition on a moving or stationary substrate. In this case, the heating tubes are permeable to vapor/carrier gas but not to powder. The CIG vapor will penetrate the lower side of the heating SiC porous tube towards the substrate. Typically, the substrate is heated using another heating circuit independent from the one that heats the heating tube and the heated chamber. The heating method can be electrical resistive heating, IR heating, or EMH as mentioned above. The substrate temperature is lower than that of the distributing side of the heating tube so that CIG vapor condenses on the substrate. The desired thickness of the CIG precursor can be achieved by controlling the speed of the substrate (in case it's moving), the substrate temperature and the pressure in the processing chamber. The CIG thickness is preferably less than 2.5 μm.

To selenize the metallic CIG precursor and convert it into a CIGS thin film, Se powder is placed in source material 405. Valve 408 needs to be opened and Valve 407 and valve 409 need to be closed, referring to FIG. 4. The Se powder is fed through the feeder tube 403 into the heating tube 401, along with the carrier gas. Once in the heating tube, Se powder vaporizes and forms a mix with the carrier gas until the target and optimal mix between the two is achieved. The vapor to gas ratio is crucial in achieving uniform and good deposition on the substrate. This target mix between Se vapor and the carrier gas can achieve the best selenization. Se vaporizes at lower temperatures compared with CIG. Therefore, the heating tube and the distribution assembly need to be kept at lower temperature compared to CIG. Typically, the substrate temperature in this case is 300-800° C., and the temperature for the Distribution Assembly is in the range of 400-800° C.

In the above procedure, NaF has been included as a layer deposited by PVD on substrate structure 400. Alternatively, NaF can be introduced using source material 406 using NaF powder. In this case, NaF can be introduced before CIG or after CIG or after Se. Moreover, NaF can be introduced simultaneously with CIG or with Se. As an example, post the CIG deposition, Valve 409 can be opened with Valves 407 and 408 closed so that NaF powder can be directed towards the heating tube 401. Once in the heating tube 401, NaF vaporizes and mixes with the carrier gas until an optimal NaFvapor/carrier gas ratio is achieved. The NaF-vapor/carrier gas mix can then be directed towards the lower side of the permeable heating tube 401 for streaming out towards the substrate. The processing temperature, pressure and the speed of the substrate (if moving) can be used to determine the amount of the NaF deposited. Typically, a small amount is need (less than 500 Å).

In another embodiment, a second heating tube station that is fully isolated from the first one can also be used for Se to avoid cross contamination during Se vaporization. In other words, independent HTDAs can be used, one for CIG and another one for Se. This can be applied on both a stationary or moving substrate.

Another procedure to form CIGS is to open the two valves 407 and 408 as shown in FIG. 4 at the same time. In this case, CIG powder and Se powder will be directed into the heating tube for vaporization. Since CIG vaporization temperature is higher than Se vaporization temperature, then the heating tube 401, referring to FIG. 4, needs to be heated to the temperature that is capable of vaporizing CIG powder which will be more than enough for vaporizing Se powder. In this case both Se and CIG powder will vaporize in the heating tube and mix with the carrier gas. The mixing ratio between the vapors and the carrier gas is important to achieve good and uniform deposition on the substrate. The gas/vapor mix will then form in the heating tube 401 and be directed towards the lower side of the permeable heating tube which faces the moving or stationary substrate for deposition of the CIG and Se to form CIGS. At a temperature ranging from 300-800° C., CIGS forms in the heating tube as well. The heating tube temperature can then be increased to a temperature capable of vaporizing CIGS and therefore, the CIGS vapor will penetrate the lower side of the tube for deposition of a CIGS thin film with a thickness less than 5 μm. In this procedure, NaF has been included as a layer deposited by PVD on the substrate structure 400.

Alternatively, NaF can be introduced using source material 406 using NaF powder. In this case, NaF can be introduced before CIG/Se or after CIG/Se or simultaneously with CIG/Se. As an example, post the CIG deposition, referring to FIG. 4, Valve 409 can be opened with Valves 407 and 408 closed so that NaF powder can be directed towards the heating tube 401. Once in the heating tube 401, NaF vaporizes and mixes with the carrier gas until an optimal NaF-vapor/carrier gas ratio is achieved. The NaF-vapor/carrier gas mix can then be directed towards the lower side of the permeable heating tube for streaming out towards the substrate 400. The processing temperature, pressure and the speed of the substrate 400 (if moving) can be used to determine the amount of the NaF deposited. Typically, a small amount is needed (less than 500 Å). Once NaF doping is completed, then Se deposition can start as explained above.

In another embodiment, another procedure to achieve forming a CIGS thin film using the above method and apparatus is to use CIGS powder in source material 404. Valve 407 can be opened, but Valve 408 and Valve 409 in this case remains closed. Using a rotary screw or a vibratory feeder, and the flow of the carrier gas 402, the CIGS powder will be directed towards the heating tube 401 to be heated and vaporized. Once CIGS powder vaporizes and mixes with the carrier gas 401, then vapor starts streaming out from the lower side of the permeable heating tube 401 (which can be made of SiC) towards the substrate 400 for deposition of CIGS film. The substrate 400 in this case is heated to a temperature in the 400-800° C. range (preferably, 500-600° C.), while the distribution chamber 410 is heated to a temperature higher than the substrate 400 in the 500-2000° C. range to keep the CIGS in vapor phase. Since the substrate 400 temperature is lower than the distribution assembly temperature, then CIGS vapor condenses on the substrate 400 forming CIGS film. The speed of the substrate 400, its temperature and the pressure of the processing chamber determines the thickness of the film which can be less than 5 μm. The substrate 400 can then be taken out using the conveyer for further processing into completed CIGS solar cells as shown in FIG. 1. In this procedure, NaF has been included as a layer deposited by PVD on the 102/101/100 substrate structure. Alternatively, NaF can be introduced using source material 406 using NaF powder as described above.

In yet another embodiment, another procedure for making CIGS thin films is disclosed which uses (In,Ga)2Se3 powder as source material 404 and CuxSe as source material 405, referring to FIG. 4. The Cu/(In+Ga) in the final CIGS film should be in the 0.80-1.0 range and the Ga/(In+Ga) ratio should be in the 0-1 range. (In,Ga)2Se3 powder can be placed in source material 404 where the valve 407 can then be opened. Carrier gas valve can also be opened. The (In,Ga)2Se3 powder will be directed using the carrier gas feeder tube 403 (which can be made from Mullite or another ceramic) into the heating tube 401. The heating tube 401 can be made from SiC. Once (In,Ga)2Se3 powder reaches the heating tube 401, the distribution chamber is heated to temperatures in the range 200-2000° C., and the substrate 400 is heated to a temperature in the range of 400-800° C., the (In,Ga)2Se3 starts vaporizing and forming a mix with the carrier gas 402. This mix can penetrate the lower side of the permeable tube towards the substrate 400 for deposition on the substrate 400. The speed of the substrate 400, the pressure of the processing chamber, and the temperature of the substrate 400 shall determine the thickness of the film to be deposited. The thickness of the (In,Ga)2Se3 layer deposited on the substrate 400 is less than 2.5 μm. To deposit CuxSe, Valve 407 and 409 can be closed, and Valve 408 can be opened. The carrier gas 402 stays flowing to direct the CuxSe powder to the heating tube 401. The heating SiC tube can be heated to the CuxSe vaporization temperature (400-1000° C.) using one of the heating methods mentioned above (electrical heating, IR heating or RF/Microwave heating). Once CuxSe powder is in the heating tube 401, then it vaporizes and forms a mixture with the carrier gas 402. This mixture then penetrates the lower porous side of the permeable heating tube 401 towards the substrate 400. The substrate temperature is 400-700° C. (preferably 500-800° C.), whereas, the distribution assembly is at higher temperature (500-700° C.). Therefore, the CuxSe vapor condenses on the substrate 400 and reacts with the already formed (In,Ga)2Se3 layer to form chalcopyrite CIGS phase of a thickness less than 5 µm. The substrate 400 can now be conveyed outside the processing chamber using the unloading lock as shown in FIG. 3 for further processing into a complete CIGS thin film solar cell. In this procedure, NaF has been included as a layer deposited by PVD on the 102/101/100 substrate structure. Alternatively, NaF can be introduced using source material 406 using NaF powder as described above.

All the above procedures for depositing CIGS thin films use an apparatus similar to the one shown in FIG. 4.

Figure 6:
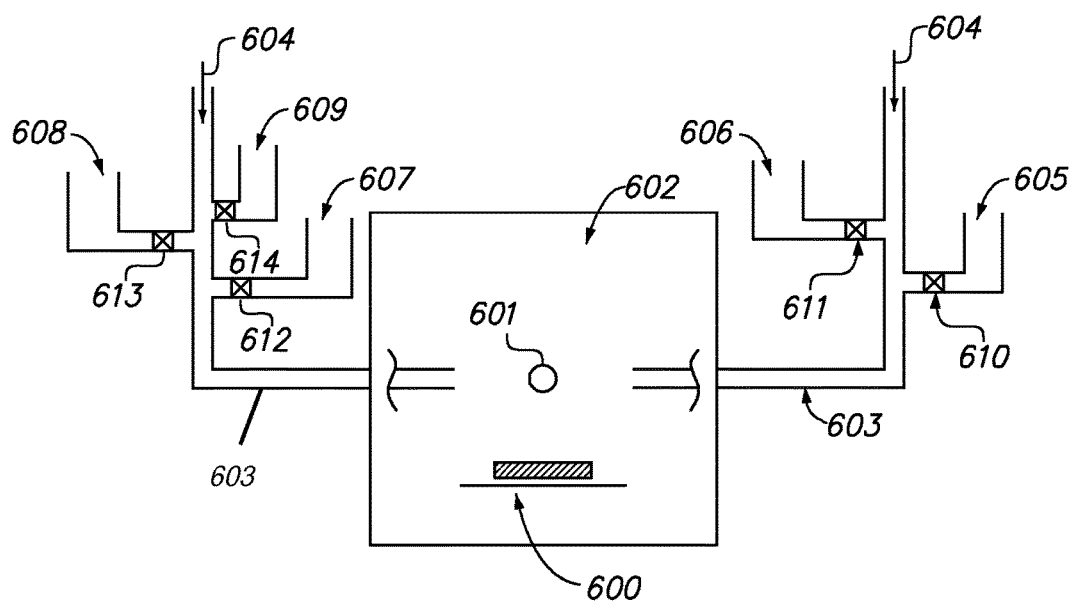
FIG. 6 is a schematic diagram illustrating of a deposition apparatus that is altered in such a way to accommodate more material sources.

In yet another aspect of the invention, the deposition apparatus can be altered in such away to accommodate more materials sources as shown in FIG. 6.

Referring to FIG. 6, the heating tube and distribution assembly (HTDA) is similar to the one shown in FIG. 4. The heating tube 601 can be made of SiC and heated using resistive electrical heating, IR heating or RF/Microwave heating to a temperature that is capable of vaporizing the material to be deposited. The heated chamber 602 which encloses the controlled environment can be heated using one of the heating methods described above to a temperature in the range of 200-2000° C. The temperature of the heated chamber 602 is capable of keeping the vapor phase from the moment it is formed until it condenses on the substrate 600 or reacts with another material that has already been deposited on the substrate 600. The substrate 600 can be conveyed to a position underneath the deposition station and heated using one of the heating methods mentioned above (i.e. resistive heating, IR heating, or RF/Microwave heating). The feeder tube 603 feeds powder into the heating tube 601 so that the heating tube heats the powder and vaporizes it. The vapor generated in the heating tube mixes with the carrier gas 604 until it forms the optimal vapor/carrier gas ratio. The vapor/gas mix is then directed to the lower side of the SiC heating permeable tube in use. The heating tube 601 can be a tubular, rectangular or semi-cylindrical heating tube as shown in FIG. 5.

Moreover, this invention discloses another method for depositing CIGS thin films on a substrate 600 (rigid glass, flexible glass, metallic sheet or plastic sheet) and conveyed using a conveyer as shown in FIG. 3 to the optimal position under the distribution/deposition station. This substrate structure 600 which is comprised of 102/101/100 can be heated to a temperature in the 400-800° C. range.

Referring to FIG. 6, the sequence of the deposition method presented here is Cu first, followed by In, followed by Ga, followed by Se. Copper (Cu) powder can be placed in source material 605; Indium (In) powder can be placed in source material 606 and selenium (Se) powder can be placed in source material 608. Valves 610, 611 and 613 remain closed. Cu, In and Se have solid phases at room temperature, but Gallium (Ga) has a liquid phase at room temperature. Ga liquid can be placed in source material 607 with Valve 612 closed. This invention also discloses a method of forming Ga powder and placing it in source material 607. Continuous cooling can be applied on source material 607 so that the temperature of source material 607 is low enough to keep Ga in solid phase. The procedure for preparing Ga powder is as follows: Ga can be cooled down, then quickly changed into powder and stored in a refrigerator. In a timely manner, Ga powder can be transferred from the refrigerator to the cooled source material 607 container so Ga remains as powder and in solid phase.

The carrier gas 604 (He, N2, Ne, etc) can be turned on. Valve 610 can be opened with all other valves closed. The feeder tube 603 will then feed Cu powder into the heating tube 601, which can be made from SiC, heated to a temperature capable of vaporizing Cu, using a rotary screw or a vibratory feeder. Once Cu powder is in the heating tube 601 which can be tubular, rectangular or hemi-cylindrical as shown in FIG. 5, then Cu starts vaporizing and mixing with the carrier gas 604. The Cu vapor/carrier gas mix needs to be at an optimal ratio for best deposition of Cu on the heated substrate 600. The Cu/carrier gas mix is then directed towards the lower side of the permeable porous tube to be directed towards the substrate 600 and then deposited as a Cu layer with a certain target thickness. This target thickness can be achieved using the process temperature, the process pressure and the speed of the substrate 600 in case the substrate is moving.

After the deposition of Cu is completed, then Valve 611 can be opened with other valves closed. In powder source material 604 can be fed into the heating tube 601 using a rotary screw or a vibratory feeder to direct In powder through the feeder tube 603 towards the heating tube 601. Once In is in the heating tube 601 that is heated to a temperature capable of vaporizing In, then In vapor starts forming and mixing with the carrier gas 604 until an optimal In-vapor/carrier gas ratio is reached. The In vapor/carrier gas mix can then be directed towards the lower side of the porous heating tube made from SiC to be streamed down towards the substrate 600 which already has a Cu layer deposited on it. In thickness target can be achieved using the process temperature, the process pressure and the speed of the substrate 600 in case the substrate is moving. Post In deposition on the substrate 600, two elements have been deposited: Cu and In. This allows the formation of CuxIny (with x and y greater than 0 and less than 1) phases. It is likely that elemental Cu and In to be present as well.

For Ga deposition, Valve 612 which is connected to Ga source that is cooled down to a temperature capable of keeping Ga in solid phase (powder) can be opened. A rotary screw or a vibratory feeder can be used to direct Ga powder through the feeder tube 603 towards the heating tube 601 which can be made from SiC and heated to a temperature capable of vaporizing Ga. Once Ga starts vaporizing, Ga vapor starts mixing with the carrier gas 604 until an optimal ratio of Ga vapor/gas is reached. The Ga-vapor/carrier gas mix is then directed towards the lower side of the permeable tube through which the Ga-vapor/carrier gas mix is streamed down towards the substrate 600 for deposition. The streaming down of Ga-vapor/carrier gas mix continues until Ga thickness target is achieved. Controlling Ga thickness can be achieved by controlling the process temperature, the process pressure and the speed of the substrate 600 in case it is moving. Post Ga deposition, three elements are deposited and the substrate 600 is likely to have a Cu(In,Ga) phase in addition to elemental phases.

For Se deposition, Valve 613 can be opened with other valves closed. Se powder is fed through the feeder tube 603 to the heating tube 601 which has already been heated to a temperature capable of vaporizing Se. Once Se vapor is directed to the heating tube 601, it vaporizes. Se vapor starts mixing with the carrier gas 604 until an optimal ratio of Se vapor/carrier gas is reached. This mix can then be streamed down to the lower side of the heating permeable and porous tube through which the Se/carrier gas mix can be streamed down towards the substrate 600 (which is heated to a temperature in the 400-800° C.) for deposition. Se vapor then arrives at the substrate 600 and reacts with the already existing phases (Cu(In,Ga), Cu, In, Ga) forming CIGS thin film of a thickness less than 5 µm.

This invention also presents a new method for doping CIGS with Sodium. Na is an important dopant for CIGS. In all embodiments above, NaF can be introduced as a separate layer on top of the 102 layer (which can be a refractory metal like Mo, W, etc.). NaF can be used as the source material and the external layer can be deposited by PVD. NaF can also be deposited at any location between the layers described in all above embodiments. Alternatively, the apparatus depicted in FIG. 6 can be used for NaF doping. NaF powder can be placed in source material 609. Valve 614 can be opened with other valves closed. NaF powder can be directed through the feeder tube 603 which can be made of Mullite or another ceramic towards the heating tube 601. NaF can be introduced before Cu deposition, after Cu deposition, after In deposition, after Ga deposition, or after Se deposition. It can also be introduced at the same time with Cu, or In, or Ga, or Se. Typically, NaF thickness is less than 500 Å.

This invention also depicts another method for depositing CIGS. All possible alterations of Cu, In, Ga, Se and NaF can be used. For example, (In, followed by Ga, followed by Se), followed by (Cu, followed by Se), followed by (In, followed by Ga, then followed by Se). The heating tube 601, the heating chamber 602 (controlled environment) and the substrate 600 need to be heated to the adequate temperatures. An optimal vapor/carrier gas mix needs to be achieved.

Another sequence is (Cu, followed by Se), then (In, followed by Ga, followed by Se); or vice versa. Again, the heating tube, the heating chamber (controlled environment) and the substrate need to be heated to the adequate temperatures. An optimal vapor/carrier gas mix needs to be achieved.

Figure 7:
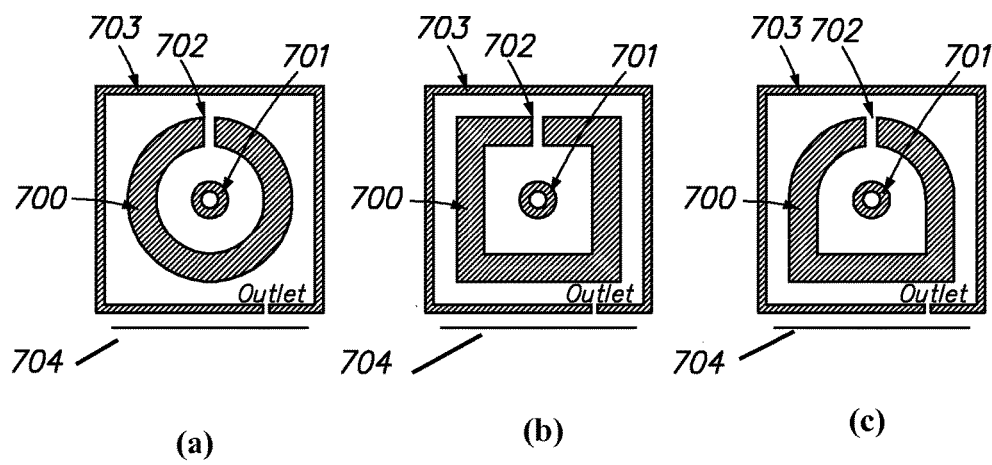
FIG. 7 is a schematic diagram illustrating cross sectional top views of another structure for a tubular, rectangular, and hemicylindrical designs of the heating tube and vapor distribution assembly.

Referring to FIG. 7, this invention also discloses another structure for designing the heating tube and distribution assembly. The heating tube 700 and distribution assembly is placed inside a sleeve 703 that can be made from impermeable ceramic material that is adequate to achieve the required temperature and has the appropriate thermal properties to keep the material vaporized until the vapor/carrier gas mix is streamed out to the substrate 704 through the lower side of the sleeve 703 and be deposited on the heated substrate which is conveyed in an optimal position under the vapor dispensing part of the sleeve 703 which has a number of outlets (e.g. 1-1000) that passes vapor/carrier gas mix towards the substrate as shown in FIG. 7. This configuration of the heating tube 700 and distribution assembly allows more time for the vapor and carrier gas to mix. Since the path the vapor/carrier gas mix needs to travel is longer in this case, it is more likely to have a more purified vapor/carrier gas mix so that powder particles are not deposited on the substrate 704. The heating tube 700 can be formed from impermeable SiC so that the vapor/carrier gas mix is directed through the opening towards the sleeve 703 for better vapor/carrier gas mixing. This method also makes the vapor/carrier gas mix clean of any solid powder particles that may make it to the substrate and degrade the material properties of the material to be deposited, and cause device degradation. The heating tube and distribution assembly shown in FIG. 7 above can be used with heating the powder material and dispensing the vapor/carrier gas mix towards the substrate 700.

Referring to FIGS. 4 and 7, the heating tube 401 (made from impermeable SiC) and distribution assembly can be any one shown in FIGS. 7 (*a*), (*b*) or (*c*). CuInGa powder is placed in material source 404, Se powder is placed in material source 405 and NaF powder is placed in material source 406. Valve 407 can be opened to direct the CIG powder towards the heating tube which is heated to the adequate temperature that is capable of vaporizing CIG powder. Once the CIG powder is in the heating tube 401, it starts vaporizing and mixing with the carrier gas. The vapor/carrier gas mix is then directed towards the sleeve 703 for better mixing. Since the path the vapor/carrier gas needs to travel is longer, then vapor/carrier gas will be clean from any CIG powder particles. The vapor/carrier gas mix is then directed by the sleeve 703 which is made from an impermeable ceramic material towards the outlets at the lower side of the sleeve that faces the substrate to be streamed out on the substrate structure 704 which is comprised of 102/101/100 as shown in FIG. 1. The substrate 100 can be glass (rigid or flexible, metallic sheet or plastic sheet). The CIG will be directed towards the substrate 704 which is placed in an optimal position underneath the lower side of the sleeve. A precursor CIG layer will then form on the substrate 704 which has been heated to a temperature of 400-800° C. and kept at an optimal distance from the outlets side of the sleeve. For Se (still referencing FIG. 4 and FIG. 7)), Valve 408 needs to be opened with Valves 407 and 409 closed, and Se powder will then be directed towards the heating tube and the distribution assembly through the feeder tube 403 using a rotary screw or a vibratory feeder. The heating tube can be made of SiC and can be heated to a temperature that is capable of keeping Se vaporized in the heating tube and the distribution assembly. Se vapor will then start mixing with the carrier gas until an optimal ratio is achieved. The Se-vapor/carrier gas mix will then travel through the opening 702 as shown in FIG. 7 towards the impermeable sleeve 703 to be directed towards the outlets side of the sleeve with outlets that are in opposite direction compared with the opening in the heating tube 700. The Se-vapor/carrier gas mix will then be streamed out the outlets in the lower side of the sleeve 703 towards the heated substrate structure 704 which is comprised of 102/101/100. Substrate 100 can be glass (rigid or flexible), metallic sheet or plastic sheet. Se will then arrive at the surface and reacts with the already formed CIG precursor to form CIGS with Cu/(In+Ga) and Ga/(In+Ga) ratios in the range of 0.7-1.0 and 0-1, respectively. The thickness of the CIGS thin film is less than 5 µm. The CIGS thin film on substrate structure 704, which is comprised of 102/101/100 can then be processed into complete solar cell as shown in FIG. 1.

For NaF doping, NaF can be placed in source material 609 as shown in FIG. 6. Na doping is typically less than 2% and can be introduced in the above embodiment before or after the CIG deposition, or after Se deposition. It can also be introduced simultaneously with either CuInGa or Se deposition. Same doping procedure for NaF explained above can be implemented in this case as well.

Different alterations of the heating tube design and the distribution assembly can be achieved such that an optimal vapor/carrier gas ratio is achieved; a clean vapor/carrier gas mix (a mix that does not have powder solid phase of the material) can be achieved; and a uniform and appropriate streaming out of the vapor/carrier gas through the distribution assembly can be achieved.

Referring again to FIG. 7, in one embodment, a filter can be used in the opening 702 of the heating tube to filter the vapor/carrier gas mix so that the vapor and the carrier gas mix passes through the filter but the powder does not.

In another embodiment of the invention, the heating tube 700 (tubular, rectangular or semi-cylindrical) can be impermeable and can be placed inside another tube which is permeable and both can be placed inside a third tube which can be impermeable. The middle tube in this case will function as a membrane to purify the vapor/carrier gas mix from any powder. A width varying slit-like slot can be opened at the lower side of the outer tube to stream out the vapor/carrier gas mix towards the substrate. Alternatively, a number of outlets can be punched in the lower end of the outer tube. In another alternative, a separate conduit can be assembled in the lower side of the outer tube in which the outlets are punched through the lower side of the conduit. In another embodiment, the sleeve 703 can be shrouded with a narrow tube that confines the sleeve and extends all the way towards the lower side of the sleeve at which point this tube extends horizontally above the substrate 704 with a number of outlets for streaming out the vapor/carrier gas mix.

In another embodiment, the substrate 704 can be faced downward instead of upward. This configuration can be achieved using certain designs that employ certain gas to float the substrate 704 into the processing zone, at which point the heating tube and distribution assembly are designed to achieve uniform deposition on the substrate which can be made of glass, metallic sheet or plastic sheet. All embodiments for deposition procedures described above can be applied on a facing-down substrate.

The above deposition procedure can be used to deposit the other layers shown in FIG. 1, including: the buffer layer 104 (e.g. CdS. ZnS, In2S3, In2Se3, etc), the i-ZnO/[(ZnO:Al), or ITO] layer 105, metallic grids/AR layer 106. In addition, the above method and apparatus can also be used to deposit the back contact layer 101 or the barrier layer 102. All these material can be formed into powder and fed into an apparatus similar to the one shown in FIG. 6 above for vaporization and deposition.

This invention also presents a new apparatus and method for depositing CIGS thin film on a substrate using the concepts and embodiments described above. Approach I above describes the growth details of the three stage process. Typically, this process is usually implemented in a bell jar system and yielded the state-of-the-art conversion efficiency of greater than 20.0%. Although this process yields high quality CIGS semiconductor material and CIGS thin solar cells, it has proven difficult and costly to scale up. This invention presents a new method and apparatus that implement the three stage process in a way that is cost effective. This new approach will be referred to as the "three step process". This method employs five heating and distribution stations independent from each other. These heating and distribution stations are capable of vaporizing Cu, In, Ga, Se and the dopant NaF. The heating tubes are made of impermeable SiC. In one embodiment of this invention, all five heating tubes and distribution stations are enclosed in the heated chamber (controlled environment) which can be heated to a temperature from ambient to 2000° C. Five heating tubes and distribution assemblies are enclosed within the heating chamber. Each heating and distribution station is comprised of two impermeable tubes. The outer impermeable tube can be made of impermeable ceramic or impermeable graphite. The heating tube can be made of SiC. The lower side of the outer impermeable tube can have a number of outlets to stream out the vapor/carrier gas mixture (1-1000).

Figure 8:
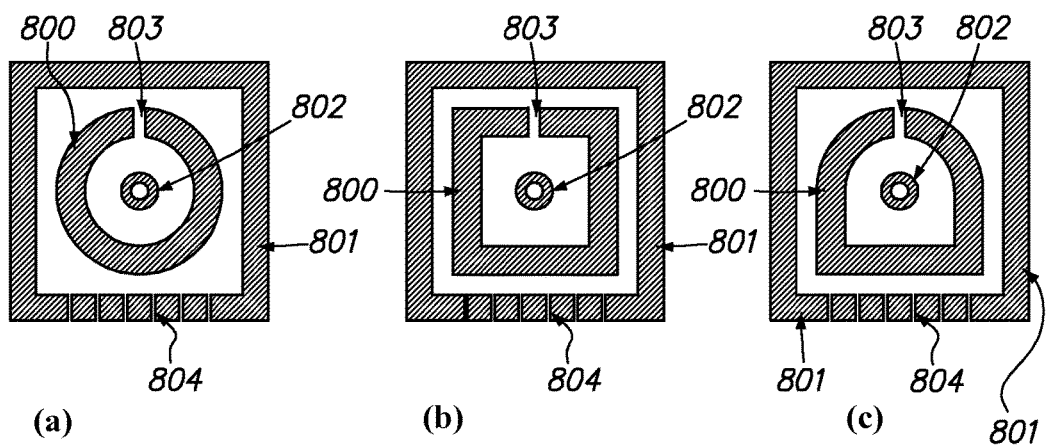
FIG. 8 is a schematic diagram illustrating cross sectional top views of yet another structure for a tubular, rectangular, and hemicylindrical designs of the heating tube and vapor distribution assembly, wherein the outer tube is made of an impermeable material and shrouds a conduit for vapor/carrier gas transport.

Referring to FIG. 8, the schematic diagram illustrates three designs for the heating tube and the distribution station. Similar to the heating tube and distribution station in FIG. 7, the heating tube and distribution station comprise of the heating tube 800, outer tube 801, feeder tube 802, heating tube opening 803, and outlets 804.

Figure 9:
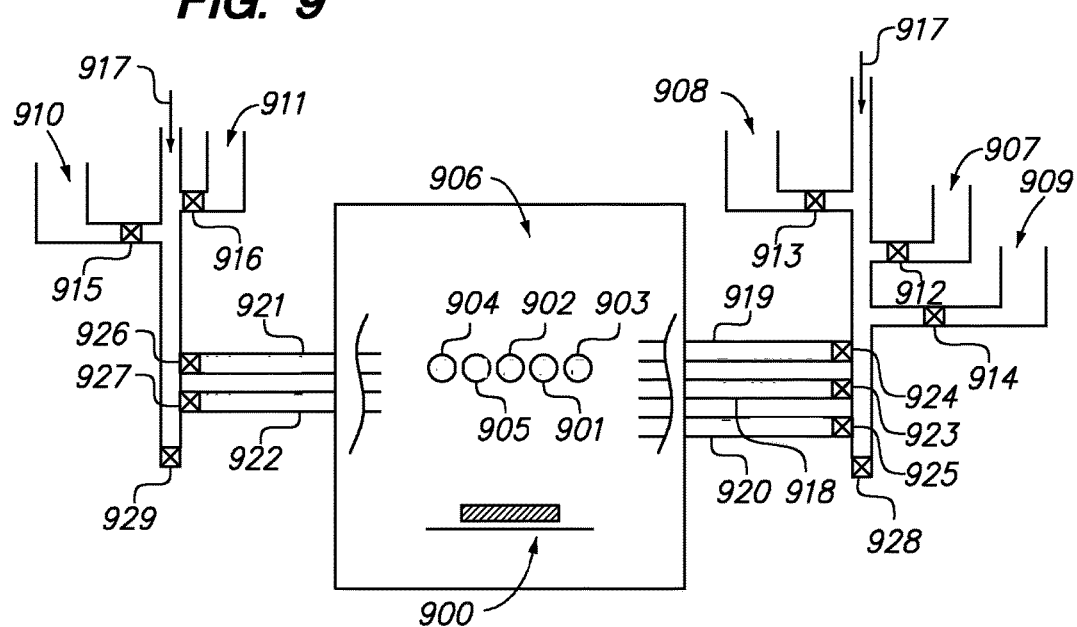
FIG. 9 is a schematic diagram illustrating an apparatus for forming CIGS thin film using a three-step process, wherein the apparatus consists of five independent heating tubes and vapor distribution stations.

Referring to FIG. 9, the schematic diagram illustrates an apparatus for forming CIGS thin films on a substrate structure 900 which is comprised of 102/101/100 as shown in FIG. 1. Substrate 100 can be glass (rigid or flexible), metallic sheets or plastic sheets. 101 can be SiO2 or any other material and 102 can be Mo, W, Ti, Ta, etc. Substrate structure 900 can be conveyed into the processing chamber using a conveyer 301 as shown in FIG. 3. Substrate structure 900 can then be positioned underneath the distribution assembly in an optimal position on a stage that is capable of rotation. The stage is also capable of moving back and forth and left and right. The distance between the substrate structure 900 and the distribution assembly can range from 1 mm to 20 cm. The heating tubes 901, 902, 903, 904, and 905 can be made of impermeable SiC. The outer tube can be made of impermeable material as Mullite, graphite or ceramic. The heated chamber 906 (controlled environment) can be heated using resistive heating, IR heating or RF/Microwave heating. The heating tubes 901, 902, 903, 904, and 905 can be heated using resistive heating, IR heating or RF/Microwave heating. All heating circuits for the five heating tubes 901, 902, 903, 904, and 905 and the heated chamber 906 are independent. So, each heating tube 901, 902, 903, 904, and 905 has its own heating circuit which does not interfere with the heating circuits of the other heating tubes and/or the heating circuit of the heated chamber 906. Temperature for each circuit can be controlled independently using thermowells.

Still referring to FIG. 9, source materials 907, 908, 909, 910, and 911 can be Cu, In, Ga, Se and NaF in powder forms, respectively. Source material 909 for Ga is cooled down to keep Ga in powder solid form. There are five heating tubes and distribution assemblies (HTDA) 901, 902, 903, 904, and 905 for Cu, In, Ga, Se and NaF, respectively. Directing the flow of powder into the respective HTDA 901, 902, 903, 904, and 905 can be achieved using the respective valves. Following is a description of using the apparatus and the 3-step process described above to form CIGS thin films with Cu/(In+Ga) and Ga/(In+Ga) ratios ranging from 0.80-1.0 and 0-1, respectively, and a total thickness of less than 5 μm.

a. Source materials 907, 908, 909, and 910 can be Cu, In, Ga and Se in powder forms, respectively. Carrier gas source 917 can be opened.

b. Step 1 [(In,Ga)2Se3-IGS] deposition: In, Ga and Se powders can be fed into heating tubes 902, 903 and 904 from source material 908, 909 and 910 using rotary screws or vibratory feeders and the flowing pressure of the carrier gas 917. Carrier gas 917 source can be opened and remains open. To direct In powder into heating tube 902 through feeder tube 919, Valves 913 and 924 can be opened with all other valves closed. Valve 928 can be opened after In deposition is completed for short time with the carrier gas flowing to clean the channel from any In powder. After that, Valve 928 needs to be closed. To direct Se powder into heating tube 904 through feeder tube 921, Valves 915 and 926 can be opened, with all other valves closed. To direct Ga powder into heating tube 903 through feeder tube 920, Valves 914 and 925 can be opened with all other valves closed. The carrier gas can be He, Ne, N2, etc. and the flow rate can be adjusted for an optimal value. In, Ga and Se powders are directed to heating tubes 902, 903, and 904 for vaporization. All three heating tubes are then heated to adequate temperatures using independent heating circuits. The heating method can be resistive, IR or RF/Microwave heating. The temperatures for heating tubes 902, 903, and 904 are capable of vaporizing In, Ga and Se, respectively. Once In, Ga and Se vaporize, they start mixing with the carrier gas 917 (each in its own independent distribution assembly) and flowing into the respective distribution assembly which is impermeable and has a number of holes on its lower side to stream out the vapor/carrier gas mix for deposition on the substrate 900 which is heated independently to a temperature in the 200-800° C. range. The process needs to be timed in such a manner that In-vapor/carrier gas, Ga-vapor/carrier gas and Se-vapor/carrier gas are directed towards the lower side of the outer tube at the same time. The vapors/carrier gas mixtures of the three materials can be streamed out towards the substrate which is heated to a temperature of 200-800° C. for (In,Ga)2Se3 (IGS) deposition. IGS thickness can be less than 2.5 μm. To achieve uniform deposition and optimal composition, the substrate can be set in rotation, and moved in different directions.

c. Step 2 (Cu2-xSe deposition): After completion of step 1 above, Valves 912 and 923 can be opened with all other valves closed so that Cu powder can be fed through feeder tube 918 into heating tube 901 using a rotary screw or a vibratory feeder. Se powder can be fed into heating tube 904 as described in point b above. Heating tubes 901 and 904 can be heated independently to temperatures adequate for vaporizing Cu and Se powders. Cu and Se vapors mix with the carrier gas 917, each in its own HTDA until optimal vapor/carrier mixtures are achieved. Cu-vapor/carrier and Se-vapor/carrier gas mixtures are then directed through openings in heating tubes 901 and 904, respectively towards their respective distribution assemblies which have a number of outlets in their lower sides for streaming out vapor towards the substrate which is kept at a temperature in the 200-800° C. range. The process needs to be timed in such a manner that Cu-vapor/carrier gas and Se-vapor/carrier gas are directed towards the lower side of the outer tube at the same time. To achieve uniform deposition and optimal composition, the substrate 900 can be set in rotation, and moved in different directions.

d. Step 3 (IGS Deposition): After step 2 of the deposition which is described in point c above is completed, CIGS film on the substrate 900 is Cu-rich. Small amounts of In, Ga and Se need to be deposited to bring the CIGS composition into Cu-poor with Cu/(In+Ga) ratio ranging from 0.70-1.0. IGS thickness in this case is about 10% of the overall CIGS thin film thickness. The procedure for depositing IGS is the same as in point b above. The film can then be taken out for further processing into a complete CIGS solar as depicted in FIG. 1.

In the above description of three step process, NaF was already included as a layer deposited on the back contact layer 102. This invention also presents a new doping method for Na. In reference to FIG. 9, NaF can be introduced before or after step 1 or after step 2 or after step 3. To introduce NaF, Valves 916 and 927 need to be opened with all other valves closed. NaF powder can then be directed to heating tube 905 for vaporization through the feeder tube 922. Heating tube 905 is heated to a temperature capable of vaporizing NaF. NaF-vapor/carrier gas will then mix and be directed towards the lower side of HTDA which has a number of outlets for streaming out NaF vapor towards the substrate 900 for doping CIGS. To clean the system from residues, valves 928 and 929 can be opened for a short time and carrier gas flows through.

In another embodiment of the invention, a two step process can also be designed. First, Cu-rich CIGS is grown by depositing Cu, In, Ga and Se. Second, In, Ga and Se are deposited in an amount necessary to bring the Cu-rich CIGS film into Cu-poor composition. The apparatus depicted in FIG. 9 and the procedures described in Method IV above can be used in this case.

The apparatus depicted in FIG. 9 can also be used for other process sequences. These sequences include CuxSe, followed by (In,Ga)2S3 or vice versa.

V. Method 5

Figure 10:
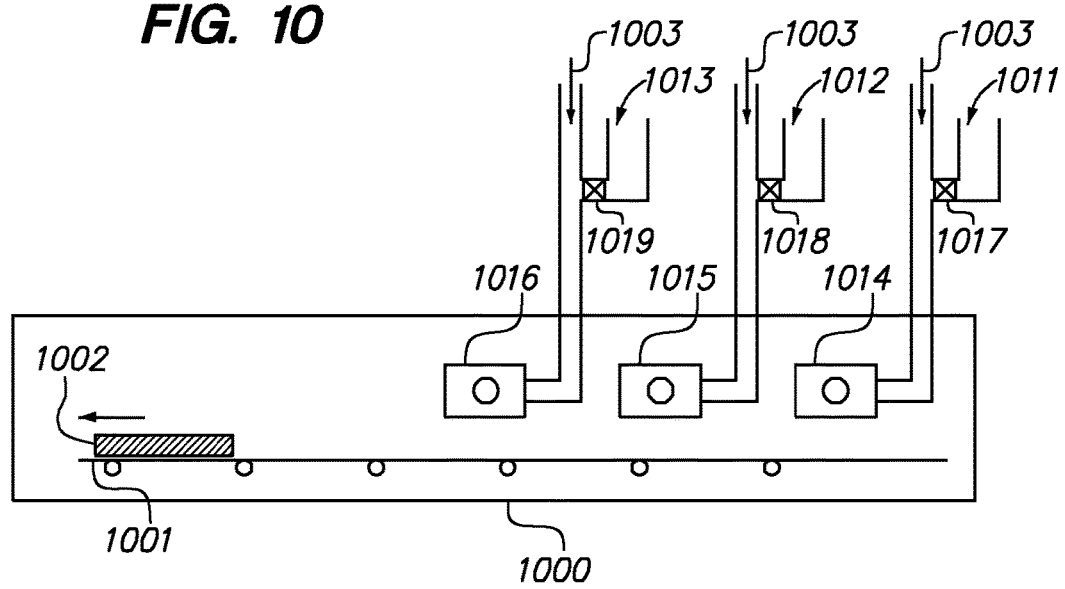
FIG. 10 is an apparatus for depositing CIGS thin films on a moving substrate. This Apparatus can be a roll-to-roll or batch tool or it can be a small lab tool.
Figure 10:
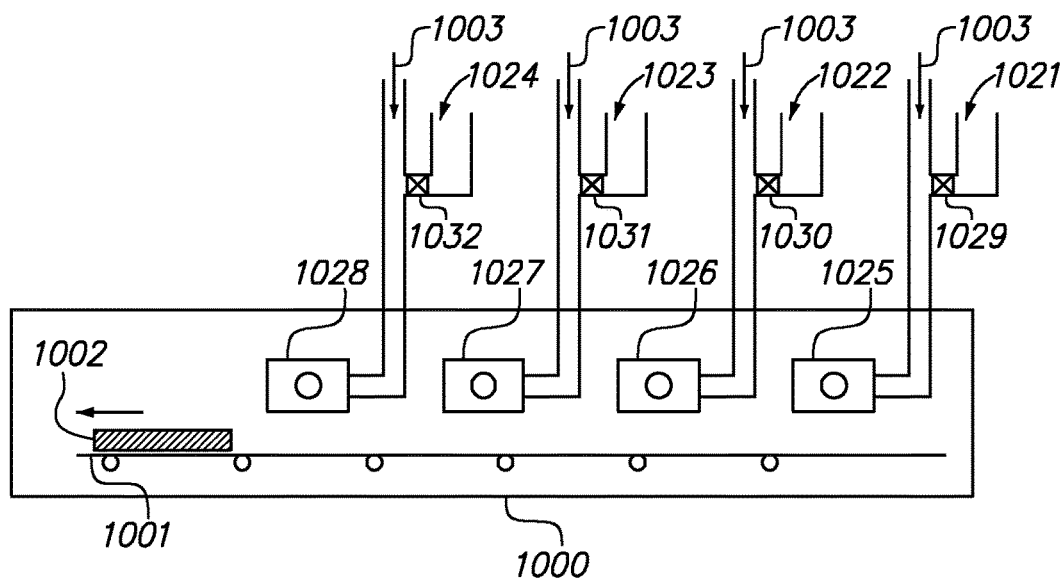
Figure 10:
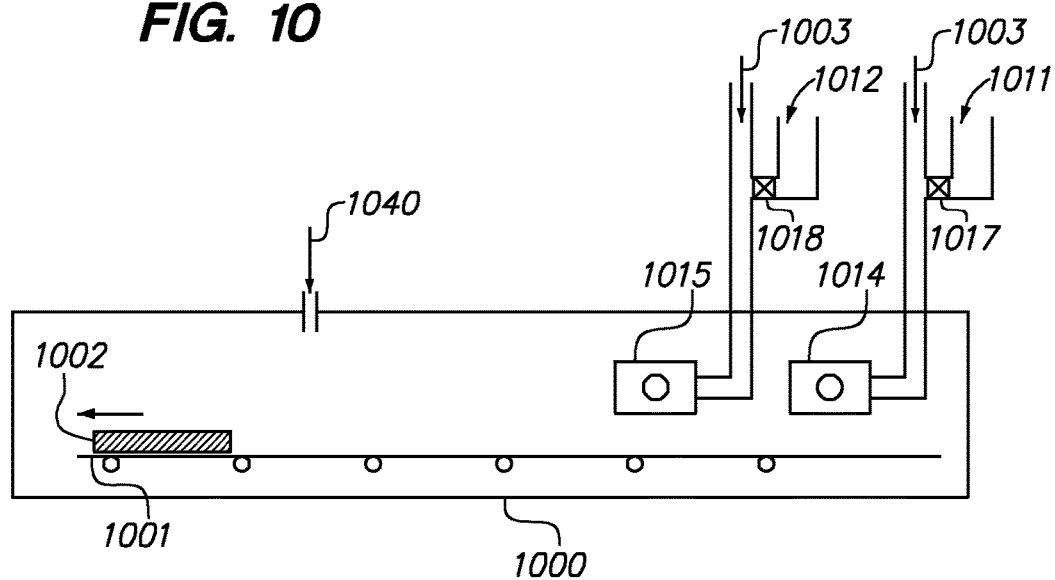
Figure 10:
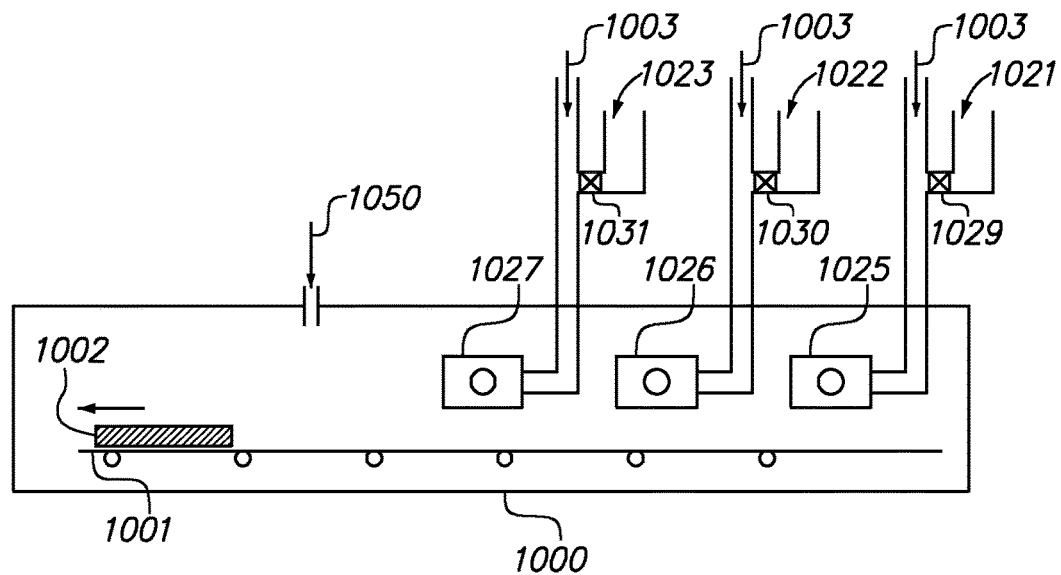

In one embodiment, the apparatus and deposition procedures described in Method 4 above can be applied on a moving substrate, which can be a roll-to-roll (R2R) tool for processing flexible sheets including flexible glass sheets (e.g. Corning® Willow™ Glass), flexible metallic sheets, or flexible plastic sheets (e.g. Polyimide); a batch tool for processing non-flexible substrates including rigid glass; or a small lab tool. Each source material can have its own deposition station, and arranged in such a way to deposit the material that needs to be deposited. Referring to FIGS. 10A-10E, the substrate can be rigid or flexible glass sheets (e.g. Corning® Willow™ Glass), or metallic, or plastic sheets, placed on a conveyor 1001. The apparatus in this case can be a roll-to-roll (R2R) tool for processing flexible sheets including flexible glass sheets (e.g. Corning® Willow™ Glass), flexible metallic sheets, or flexible plastic sheets (e.g. Polyimide). The apparatus can also be a batch tool for processing non-flexible substrates including rigid glass. The apparatus can also be a small lab tool. FIG. 10(a) through (d) depicts an example for such apparatus. Referring to FIG. 10A, in one embodiment, a processing chamber 1000 is depicted and comprises three deposition stations and a conveyor belt 1001, which moves the substrate structure 1002 to be placed under the respective station so that the respective material can be deposited. CIG, NaF and Se powders 1011, 1012, and 1013, respectively, can be placed as depicted in FIG. 10(a). CIG, NaF and Se powders 1011, 1012, and 1013, respectively, can then be directed towards their respective heating tubes 1014, 1015, and 1016, respectively, through their respective feeder tubes by opening their respective valves, 1017, 1018, and 1019, respectively and using rotary screws or vibratory feeders and the flow of the carrier gas 1003. The heating tubes can be made from impermeable SiC. The substrate structure 1002 used here has 101 and 102 layers with no NaF deposited. Any design of the HTDAs shown in FIG. 5, 7 or 8 can be used. In one embodiment, referring to FIG. 8 briefly, each heating and distribution station is comprised of two impermeable tubes. The outer impermeable tube can be made of impermeable ceramic or impermeable graphite or mullite. The heating tubes can be made of SiC and can be heated to an adequate temperature capable of vaporizing the material to be deposited. The lower side of the outer impermeable tube can have a number of outlets to stream out the vapor/carrier gas mixture (1-1000). Referring back to FIG. 10A, in one embodiment, Once the CIG powder 1011 is in its heating tube, it starts vaporizing and mixing with the carrier gas 1003 until an optimal ratio is achieved. CIG-vapor/carrier gas mix is then directed towards the lower side of the impermeable outer tube for streaming out through the outlets towards the moving substrate 1002. Because of the moving substrate, CIG thickness needs to be controlled using processing temperature, processing pressure and the speed of the substrate. Once the CIG target thickness is achieved, then the substrate is conveyed towards the NaF doping station, where a small amount of NaF 1012 (less than 500 Å) can be introduced by following the same aforesaid vaporizing and gas mixing procedure. After the NaF doping, the substrate moves to the Se station, where the metallic precursor gets selenized. Timing in this method is crucial. The target thickness for In needs to be controlled in such away to make the Cu/(In+Ga) and the Ga/(In+Ga) ratios in the ranges 0.7-1.0 and 0-1, respectively. The thickness CIGS thin film can be less than 5 μm.

Referring to FIG. 10B, in one embodiment, the processing chamber 1000 now comprises four deposition stations and a conveyor belt 1001, which moves substrate structures 1002. CuGa and In powders, 1021 and 1023, respectively, can be used in two sources as depicted. The aforesaid procedure for depositing CIG, NaF and Se, depicted in FIG. 10A, can be repeated for CuGa, NaF, In, and Se powders, 1021, 1022, 1023, and 1024, respectively, with four heating tubes, 1025, 1026, 1027, and 1028, respectively, and four control valves, 1029, 1030, 1031, and 1032, respectively, in four deposition stations.

Referring to FIG. 10C, in one embodiment, the procedure is similar to the one depicted in FIG. 10A, with similar processing chamber 1000, conveyor belt 1001, substrates 1002, and deposition stations for CIG and NaF, with one exception; Se is introduced through H2Se gas source 1040 directly onto the heated substrate for selenizing metallic precursors, deposited using CIG and NaF as depicted.

Referring to FIG. 10D, in one embodiment, the procedure is similar to the one depicted in FIG. 10B, with similar processing chamber 1000, conveyor belt 1001, and substrates 1002, and deposition stations for CuGa, NaF, and In, with one exception; Se is introduced through H2Se gas source 1050 directly onto the heated substrate 1002 for selenizing metallic precursors, deposited using CuGa, NaF, and In as depicted. In another embodiment, SeF6 (Selenium hexafluoride) can be used instead of H2Se for selenizing (Cu,In,Ga) metals and their metallic alloys. This applies in all embodiments in this invention disclosure that use H2Se for selenizing the Cu, In and Ga precursor.

Moreover, it is appreciated by a person ordinarily skilled in the art that different combinations of materials can be used to form CIGS in an apparatus similar to the one depicted in FIGS. 10A-10D. For example, powders of (In,Ga)2Se3, CuxSe, CIGS, CGS, CIS, etc. can be used in any order that achieves the Cu/(In+Ga) and the Ga/(In+Ga) ratios of 0.7-1.0 and 0-1, respectively.

The invention claimed is:
1. A method for deposition of one or more elements and compounds onto a solar cell substrate comprising:
  a. providing a substrate;
  b. providing one or more elements and compounds for deposition to said substrate;
  c. providing a housing;
  d. providing a transporting apparatus to transport said substrate in and out of said housing;
  e. placing said substrate onto said transporting apparatus and having said transporting apparatus transport said substrate into said housing;
  f. providing one or more tubing apparatus to deliver powders of said one or more elements and compounds to said housing wherein said tubing apparatus is comprised of one or more feeder tubes located outside of said housing and joined to said housing; a plurality of source material tubes located outside of said housing and joined to said feeder tubes; a plurality of valves located inside of said source material tubes sufficient to block access between said source material tubes and said feeder tubes; one or more heating tubes located inside of said housing and connected to said feeder tubes;
  g. placing said one or more elements and compounds into said source material tubes;
  h. opening said valves to allow said one or more elements and compounds to move into said feeder tubes;
  i. providing a portion of carrier gas and feeding said carrier gas into said feeder tubes;
  j. allowing said carrier gas to carry said one or more elements and compounds from said feeder tubes to said heating tubes;
  k. providing one or more thermal sources to heat said housing and said heating tubes and heating said housing and said heating tubes;
  l. vaporizing said one or more elements and compounds inside said heating tubes into a vapor and allowing said vapor to leave said heating tubes;
  wherein said heating tubes comprise upper and lower portions;
  wherein said lower portions face said substrate and said upper portions are opposite to said lower portions;
  wherein only said lower portions are permeable to said vapor and said carrier gas;
  m. allowing said one or more elements and compounds to deposit onto said substrate after said one or more elements and compounds leave said heating tubes;
  n. transporting said substrate outside of said housing after said one or more elements and compounds are deposited onto said substrate.

2. The method of claim 1 wherein said feeder tubes and said heating tubes are constructed with Silicon Carbide.

3. The method of claim 1 wherein said heating tubes are heated to a temperature between 50-2000° C.

4. The method of claim 1 wherein said one or more elements and compounds are in powder form.

5. The method of claim 1 wherein said carrier gas is one or more of Helium, Nitrogen, Neon and Argon.

6. The method of claim 1 wherein said heating tubes are rectangular in form.

7. The method of claim 1 wherein said feeder tubes are rectangular in form.

8. The method of claim 1 wherein said heating tubes are semi-cylindrical in form.

9. The method of claim 1 wherein said feeder tubes are semi-cylindrical in form.

10. The method of claim 1 wherein said housing is made of one or more of mullite, graphite, ceramic and Silicon Carbide (SiC).

11. The method of claim 1 wherein said heating tubes are permeable to said vapor and said carrier gas but not to said one or more elements and compounds in powder form.

12. The method of claim 1 wherein said thermal source is one or more of electrical power heating, IR heating, and microwave/RF heating.

13. The method of claim 1 wherein said heating tubes have larger perimeters than said feeder tubes'.

14. The method of claim 1 wherein said housing and heating tubes constitute a controlled, monitored and contained environment.

15. The method of claim 14 wherein said controlled, monitored and contained environment comprises an enclosure that encloses said heating tubes and one or more sleeves wherein said sleeves allow said vapor to escape from said heating tubes.

16. The method of claim 15 wherein said sleeves allow said vapor to escape from said enclosure.

17. The method of claim 1 wherein said transporting apparatus is comprised of a conveyor belt.

18. A method of deposing one or more elements and compounds onto a solar cell substrate comprising:
   a. providing a housing having a transporting apparatus in said housing;
   b. loading a substrate onto said transporting apparatus;
   c. providing a first element to a first source material tube wherein said first element is CuInGa (CIG) powder;
   d. applying a portion of a first carrier gas into a first feeder tube wherein said first carrier gas carries said CuInGa (CIG) powder into a first heating tube;
   e. heating said first heating tube thereby vaporizing said CuInGa (CIG) powder and turning said CuInGa (CIG) powder to CuInGa (CIG) vapor;
   f. allowing said CuInGa (CIG) vapor to deposit onto said substrate as said substrate is transported by said transporting apparatus to a first area nearing said first heating tube;
   g. providing a second element to a second source material tube wherein said second element is NaF powder;
   h. applying a portion of a second carrier gas into a second feeder tube wherein said second carrier gas carries said NaF powder into a second heating tube;
   i. heating said second heating tube thereby vaporizing said NaF powder and turning said NaF powder to NaF vapor;
   j. allowing said NaF vapor to deposit onto said substrate as said substrate is transported by said transporting apparatus to a second area nearing said second heating tube;
   k. providing a third element to said third source material tube wherein said third element is Se powder;
   l. applying a portion of a third carrier gas into said third feeder tube wherein said third carrier gas carries said Se powder into said third heating tube;
   m. heating said third heating tube thereby vaporizing said Se powder and turning said Se powder to Se vapor;
   n. allowing said Se vapor to deposit onto said substrate as said substrate is transported by said transporting apparatus to a third area nearing said third heating tube.

19. A method of depositing one or more elements and/or compounds onto a solar cell substrate comprising:
   a. providing a housing having a transporting apparatus in said housing;
   b. loading a substrate onto said transporting apparatus;
   c. providing a first element to a first source material tube wherein said first element is CuInGa (CIG) powder;
   d. applying a portion of first carrier gas into a first feeder tube wherein said first carrier gas carries said CuInGa (CIG) powder into a first heating tube;
   e. heating said first heating tube thereby vaporizing said CuInGa (CIG) powder and turning said CuInGa (CIG) powder to CuInGa (CIG) vapor;
   f. allowing said CuInGa (CIG) vapor to deposit onto said substrate as said substrate is transported by said transporting apparatus to a first area nearing said first heating tube;
   g. providing a second element to a second source material tube wherein said second element is NaF powder;
   h. applying a portion of a second carrier gas into a second feeder tube wherein said second carrier gas carries said NaF powder into a second heating tube;
   i. heating said second heating tube thereby vaporizing said NaF powder and turning said NaF powder to NaF vapor;
   j. allowing said NaF vapor to deposit onto said substrate as said substrate is transported by said transporting apparatus to a second area nearing said second heating tube;
   k. providing a third element to a third source material tube wherein said third elements is In powder;
   l. applying a portion of a third carrier gas into a third feeder tube wherein said third carrier gas carries said In powder into a third heating tube;
   m. heating said third heating tube thereby vaporizing said In powder and turning said In powder to In vapor;
   n. allowing said In vapor to deposit onto said substrate as said substrate is transported by said transporting apparatus to a third area nearing said third heating tube;
   o. providing a fourth element to a fourth source material tube wherein said fourth element is Se powder;
   p. applying a portion of a fourth carrier gas into a fourth feeder tube wherein said fourth carrier gas carries said Se powder into a fourth heating tube;
   q. heating said fourth heating tube thereby vaporizing said Se powder and turning said Se powder to Se vapor;
   r. allowing said Se vapor to deposit onto said substrate as said substrate is transported by said transporting apparatus to a fourth area nearing said fourth heating tube.

20. A method of depositing a plurality of elements onto a solar cell substrate comprising:
   a. providing a housing having a transporting apparatus in said housing;
   b. loading a substrate onto said transporting apparatus;
   c. providing a first element to a first source material tube wherein said first element is CuInGa (CIG) powder;
   d. applying a portion of first carrier gas into a first feeder tube wherein said first carrier gas carries said CuInGa (CIG) powder into a first heating tube;
   e. heating said first heating tube thereby vaporizing said CuInGa (CIG) powder and turning said CuInGa (CIG) powder to CuInGa (CIG) vapor;
   f. allowing said CuInGa (CIG) vapor to deposit onto said substrate as said substrate is transported by said transporting apparatus to a first area nearing said first heating tube;
   g. providing a second element to a second source material tube wherein said second element is NaF powder;
   h. applying a portion of second carrier gas into a second feeder tube wherein said second carrier gas carries said NaF powder into a second heating tube;
   i. heating said second heating tube thereby vaporizing said NaF powder and turning said NaF powder to NaF vapor;
   j. allowing said NaF vapor to deposit onto said substrate as said substrate is transported by said transporting apparatus to a second area nearing said second heating tube;
   k. providing a first portion of Se vapor into said housing via a Se duct;

l. allowing said Se vapor to deposit onto said substrate as said substrate is transported by said transporting apparatus to a third area nearing said Se duct.

21. A method of depositing a plurality of elements onto a solar cell substrate comprising:
   a. providing a housing having a transporting apparatus in said housing;
   b. loading a substrate onto said transporting apparatus;
   c. providing a first element to a first source material tube wherein said first element is CuInGa (CIG) powder;
   d. applying a portion of a first carrier gas into a first feeder tube wherein said first carrier gas carries said CuInGa (CIG) powder into a first heating tube;
   e. heating said first heating tube thereby vaporizing said CuInGa (CIG) powder and turning said CuInGa (CIG) powder to CuInGa (CIG) vapor;
   f. allowing said CuInGa (CIG) vapor to deposit onto a substrate as said substrate is transported by said transporting apparatus to a first area nearing said first heating tube;
   g. providing a second element to a second source material tube wherein said second element is NaF powder;
   h. applying a portion of a second carrier gas into a second feeder tube wherein said second carrier gas carries said NaF powder into said second heating tube;
   i. heating said second heating tube thereby vaporizing said NaF powder and turning said NaF powder to NaF vapor;
   j. allowing said NaF vapor to deposit onto said substrate as said substrate is transported by said transporting apparatus to a second area nearing said second heating tube;
   k. providing a third element to a third source material tube wherein said third element is In powder;
   l. applying a portion of a third carrier gas into a third feeder tube wherein said third carrier gas carries said In powder into said third heating tube;
   m. heating said third heating tube thereby vaporizing said In powder and turning said In powder to In vapor;
   n. allowing said In vapor to deposit onto said substrate as said substrate is transported by said transporting apparatus to a third area nearing said third heating tube;
   o. providing a first portion of Se vapor into said housing via a Se duct;
   p. allowing said Se vapor to deposit onto said substrate as said substrate is transported by said transporting apparatus to a fourth area nearing said Se duct.

* * * * *